United States Patent

Suehiro et al.

[11] Patent Number: 6,100,193
[45] Date of Patent: Aug. 8, 2000

[54] METHOD OF MANUFACTURING A SEMICONDUCTOR DEVICE

[75] Inventors: Shintaro Suehiro; Yasushi Akasaka; Kyoichi Suguro, all of Yokohama; Kazuaki Nakajima, Tokyo; Tadashi Iijima, Yokohama, all of Japan

[73] Assignee: Kabushiki Kaisha Toshiba, Kawasaki, Japan

[21] Appl. No.: 08/936,532

[22] Filed: Sep. 24, 1997

Related U.S. Application Data

[62] Division of application No. 08/767,149, Dec. 16, 1996, Pat. No. 5,719,410, which is a continuation of application No. 08/364,922, Dec. 28, 1994, abandoned.

[51] Int. Cl.[7] .................................................. H01L 21/44
[52] U.S. Cl. ........................ 438/685; 438/785; 438/791
[58] Field of Search ...................... 438/692, 653, 438/657, 664, 683, 656, 660, 685, 785, 791

[56] References Cited

U.S. PATENT DOCUMENTS

| | | | |
|---|---|---|---|
| 5,503,704 | 4/1996 | Bower et al. | 156/281 |
| 5,529,954 | 6/1996 | Iijima et al. | 438/653 |
| 5,593,924 | 1/1997 | Apte et al. | 438/647 |
| 5,668,394 | 9/1997 | Lur et al. | 257/413 |
| 5,976,975 | 7/1999 | Joshi et al. | 438/672 |
| 5,981,380 | 11/1999 | Trivedi et al. | 438/639 |

*Primary Examiner*—David Nelms
*Assistant Examiner*—Reneé R. Berry
*Attorney, Agent, or Firm*—Oblon, Spivak, McClelland, Maier & Neustadt, P.C.

[57] ABSTRACT

A MOSFET in which the gate electrode is formed of a polycrystalline silicon film, a silicon nitride film having a nitrogen surface density of lens than $8\times10^{14}$ cm$^{-2}$, and a tungsten film—these films formed one upon another in the order mentioned. The gate electrode thus formed, serves to shorten the delay time of the MOSFET.

25 Claims, 10 Drawing Sheets

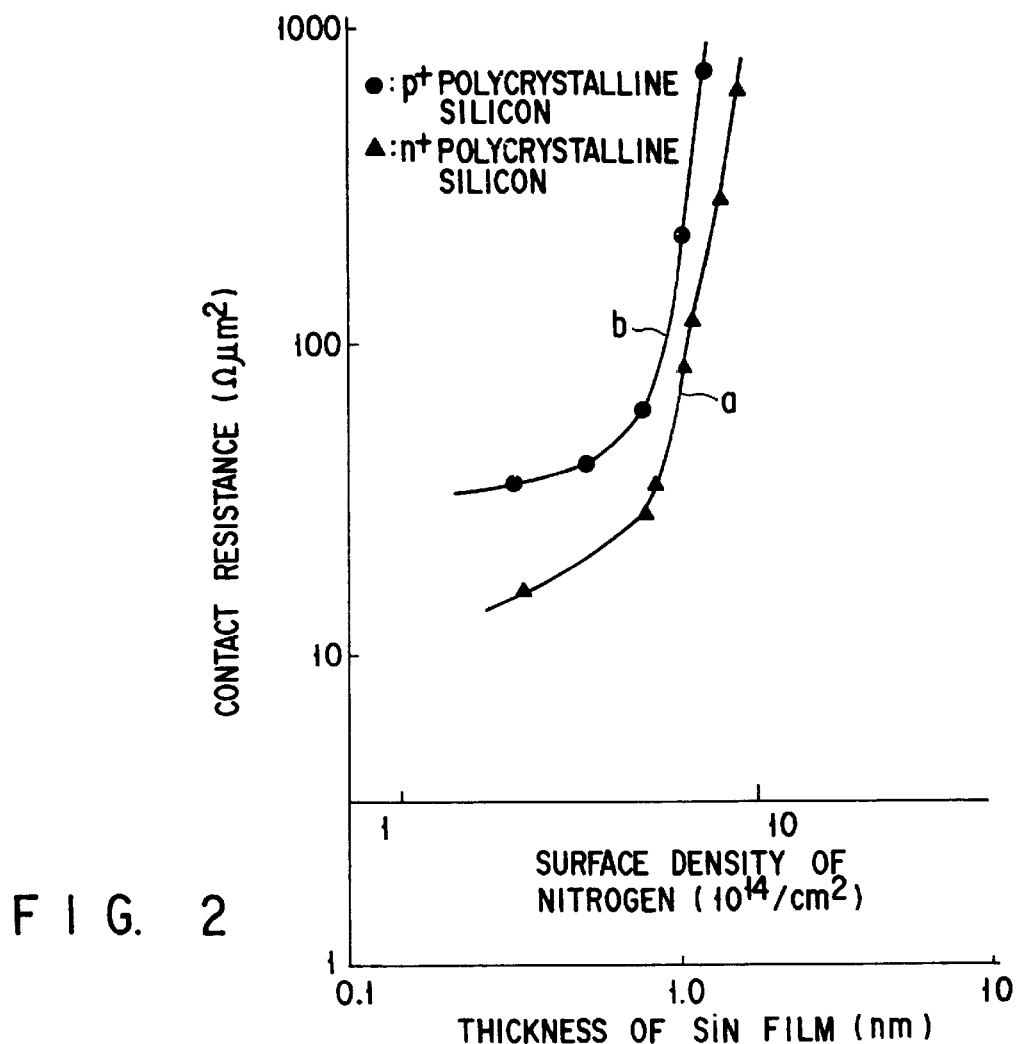
F I G. 2
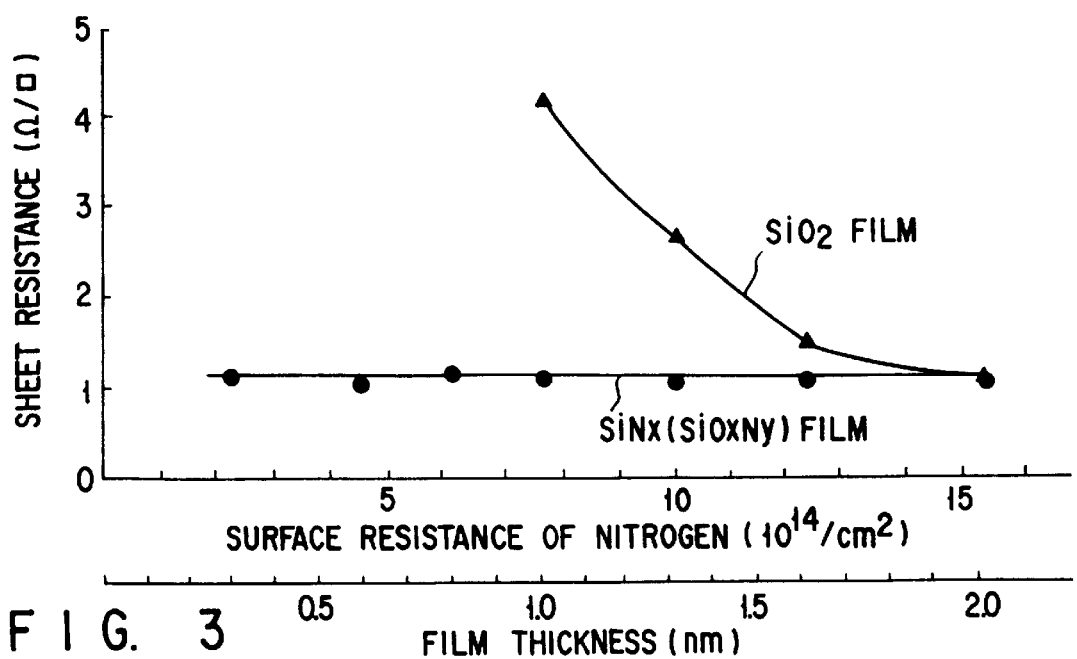
F I G. 3

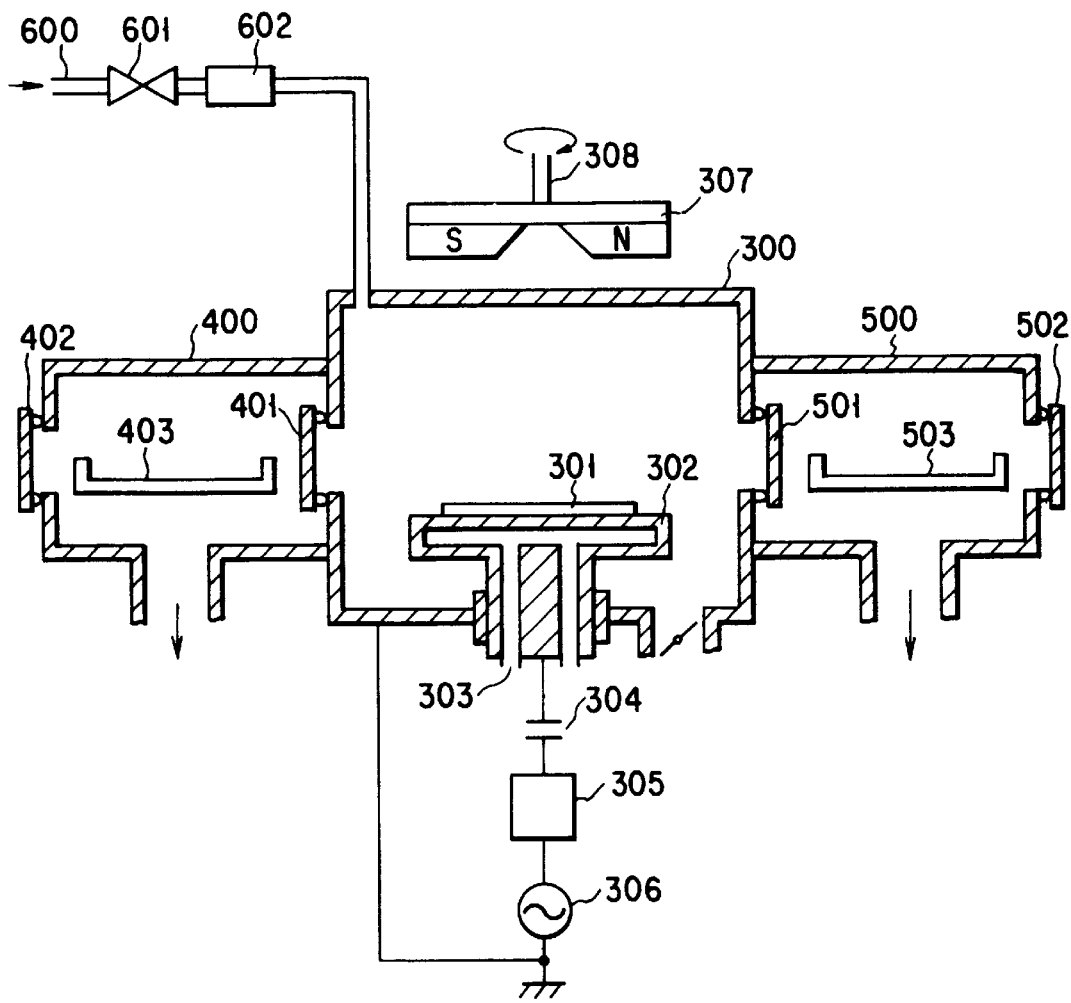
F I G. 17

METHOD OF MANUFACTURING A SEMICONDUCTOR DEVICE

This is a division of application Ser No. 08/767,149 filed Dec. 16, 1996, now U.S. Pat. No. 5,719,410, which is a continuation of application Ser. No. 08/364,922, filed Dec. 28, 1994, now abandoned.

BACKGROUND OF THE INVENTION

1. Field of the Invention

The present invention relates to a semiconductor device and a method of manufacturing the same, and more particularly to an improvement of electrodes and wiring of a semiconductor device and also a method of the electrodes and the wiring.

2. Description of the Related Art

The major sections of computers and communication apparatuses incorporate large-scale integrated circuits (LSIs), each comprising many transistors and many resistors which are electrically connected, forming electric circuits on a single semiconductor chip. The operating efficiency of a computer or a communication apparatus largely depends on the operating efficiencies of the LSIs used in the computer or the apparatus. The operating efficiency of each LSI can be enhanced by increasing the integration density of the LSI—that is, by making the elements constituting the LSI smaller.

In recent years, the sizes of LSI elements have been reduced. Thanks to the size-reduction of LSI elements, the integration densities of LSIs have been increased and the operating speeds thereof have been raised. The higher the speed of each LSI element, the more greatly it is restricted by the RC delay of the gate electrode or gate wiring of the LSI element.

The RC delay can be decreased by increasing the thickness of the gate electrode or the gate wiring, thereby decreasing the resistance of the electrode or wiring, even if the material of the gate electrode or the gate wiring is not changed. An increase in the thickness of the gate electrode or wiring is, however, problematical in view of the process of forming the gate electrode or the gate wiring. In the case of the gate electrode, it is desired that its aspect ratio (i.e., the ratio of the gate height to the gate length) should not greatly exceed the value of 1.

There is available a method of decreasing the resistance of the gate electrode without increasing the thickness of the electrode. The method is to form the electrode of a two-layer film consisting of a polycrystalline silicon layer and a refractory metal silicide layer. If this method is employed, the threshold voltage of the LSI element having the gate electrode can be controlled by the method used in the conventional process of forming silicon gates. In addition, such a two-layer film can be easily formed by the conventional process of forming silicon gates since most refractory metal silicides have high thermal resistance.

If a MOSFET having a gate length of, for example, 0.3 $\mu$m or less has its gate electrode made of such a two-layer film, the thickness of the refractory metal silicide layer is limited to about 100 to 200 nm. In this case, the sheet resistance of the gate electrode layer can be decreased to only about a few tens of ohms per unit area.

Assume that a gate electrode having a width of 0.25 $\mu$m and a sheet resistance of about 1$\Omega$/□ has been formed of a two-layer film which consists of a polycrystalline silicon layer and a refractory metal silicide layer. Then, the refractory metal silicide layer has a thickness of about 1 $\mu$m. Inevitably, this gate electrode has an aspect ratio as high as 4 to 5. It is therefore difficult to pattern the gate electrode and to form an inter-layer insulating film on the patterned gate electrode.

It has been proposed that the small gate electrode of a MOSFET be made of a two-layer film consisting of a layer of a polycrystalline silicon layer and a refractory metal layer (e.g., a tungsten or molybdenum layer) which has a lower resistance than refractory metal silicides but sufficient thermal resistance, so that the gate may have a thickness of 100 nm and a sheet resistance of a few ohms per unit area. If the refractory metal layer is made of tungsten, tungsten reacts with silicon at a temperature of about 600° C., forming tungsten silicide, though it is said to hardly react with silicon. As a consequence, the resistance of gate electrode increases.

To prevent the reaction of tungsten with silicon, a reaction-inhibiting film may be interposed between a polycrystalline silicon layer and a refractory metal layer. Jpn. Pat Appln. KOKAI Publication No. 60-195975, for example, discloses that a silicon nitride film effectively prevents a molybdenum layer from reacting with a polycrystalline silicon layer. The publication teaches that the silicon nitride film should desirably have a thickness ranging from 1 nm to 5 nm in order to allow a tunnel current to flow between the molybdenum layer and the polycrystalline silicon layer.

As the element size is reduced, it becomes more difficult to control the size of any part of the element and to provide the part in a desired shape. The size of the gate electrode of a MOSFET greatly affect the operating efficiency of the MOSFET. Hence, it is demanded that process techniques be developed for providing a gate electrode whose width (gate length) is little different from the design size.

A two-layer film consisting of a layer of a polycrystalline silicon layer and a tungsten layer (a refractory metal layer) may be dry-etched to form the gate electrode of a MOSFET. If this is the case, the two-layer film is etched for a time long enough to etch away a film which has the same structure but is a thicker by $\alpha$. The process for etching a film of the extra thickness is known as "over etching." The over etching must be performed because a two-layer film generally has at least one portion thicker than the other portions. Unless the film is etched even after the other portions have been etched, its thicker portion cannot be etched completely.

Here arises a problem. The tungsten layer is etched more slowly than the polycrystalline silicon layer. The polycrystalline silicon layer is greatly etched when the tungsten layer is over-etched. Assume that the two-layer film is dry-etched by, for example, RIE (Reactive Ion Etching) in which $SF_6$ gas and $Cl_2$ gas are applied to the two-layer film at flow rates of 40 SCCM and 10 SCCM, respectively, in an atmosphere at a pressure of 10 mTorr, a high-frequency voltage of 0.7 W/cm$^2$ is applied to the two-layer film, and the two-layer film is maintained at 70° C. Then, the tungsten layer is etched at the rate of about 180 nm/min, whereas the polycrystalline silicon layer beneath the tungsten layer is etched at the rate of about 700 nm/min. The ratio of the etching rate of the tungsten layer to that of the polycrystalline silicon is inevitably as low as about 0.3.

Hence, even of the two-layer film which consists of a layer of a polycrystalline silicon layer and a tungsten layer (a refractory metal layer) is dry-etched, it is impossible to form a patterned gate electrode which has a desired shape.

SUMMARY OF THE INVENTION

The first object of the present invention is to provide a semiconductor device in which the delay of signal transfer, resulting from contact resistance, is decreased, and also a method of manufacturing the semiconductor device.

The second object of the invention is to provide a semiconductor device which has electrodes (wiring), each made of a two-layer film which is not oxidized excessively and which is comprised of a first conductive layer containing silicon and nitrogen and a second conductive layer, and also to provide a method of manufacturing the semiconductor device.

The third object of the invention is to provide a semiconductor device which has electrodes (wiring) easy to pattern to have desired shapes, and to provide a method of manufacturing the semiconductor device.

To achieve the first object, there are provided two semiconductor devices and a methods of manufacturing either device.

According to the first aspect of the invention, there is provided a semiconductor device comprising at least one of an electrode and a wiring which comprises: a silicon film; a film formed on the silicon film, containing nitrogen and silicon and having a nitrogen surface density of less than $8 \times 10^{14}$ cm$^{-2}$; and a refractory metal film formed on the film.

According to the second aspect of the invention, there is provided a semiconductor device comprising at least one of an electrode and a wiring which comprises: a silicon film; a first film formed on the silicon film, containing nitrogen and silicon and having a nitrogen surface density of less than $8 \times 10^{14}$ cm$^{-2}$; a second film formed on the first film, containing refractory metal and nitrogen; and a third film formed on the second film, the third film being made of the refractory metal.

According to the third aspect of the invention, there is provided a method of manufacturing a semiconductor device, comprising the steps of: forming a silicon film on a substrate; forming a first film containing metal and nitrogen on the silicon film, the metal being of such a type that a negative value is obtained by subtracting a decrease in Gibbs free energy occurring in forming a nitride of silicon from a decrease in Gibbs free energy occurring in forming a nitride of the metal; and heating the film, thereby changing all or part of the first film to a second film made of the metal and forming a third film containing nitrogen and silicon between the second film and the silicon film to form at least one of an electrode and a wiring which includes the silicon film, the second film, and the third film.

In the semiconductor devices and the method, described above, it is desirable that the metal be a refractory metal and that the film containing nitrogen and silicon have a nitrogen surface density of less than $8 \times 10^{14}$ cm$^{-2}$.

The refractory metal is, for example, tungsten or molybdenum. Preferable as refractory metal is one which does not chemically react with the film. The metal may be, for example, molybdenum, tungsten, niobium, tantalum or copper. On the film of the refractory metal which does not chemically react, there may be formed a metal film which is made mainly of copper or silver.

The nitrogen surface density is the number of nitrogen atoms existing per unit area and can be measured by, for example, X-ray Photoelectron spectroscopy (XPS).

It does not matter even if the film containing nitrogen and silicon contains a component of the atmosphere, such as oxygen. For instance, no problem will arise even if the film contains 20% of oxygen. The film containing nitrogen and silicon is not limited to one formed by the re-distribution of nitrogen from a film containing a refractory metal and nitrogen. The film may be one formed by nitriding performed in an NH3 atmosphere or one formed by plasma-nitriding conducted in a nitrogen-containing atmosphere.

To achieve the second object described above, there are provided a semiconductor device and a method of manufacturing the device.

According to the fourth aspect of the invention, there is provided a method of manufacturing a semiconductor device, comprising the steps of: forming a semiconductor film on a substrate; forming a first conductive film containing refractory metal and nitrogen on the semiconductor film; and heating the first conductive film, thereby changing all or part of the first conductive film to a second conductive film made of refractory metal and forming a third conductive film containing nitrogen and semiconductor element of the semiconductor film to form at least one of an electrode and a wiring which includes the semiconductor film, the second conductive film, and the third conductive film. Preferably, the first conductive film is an amorphous conductive film.

According to the fifth aspect of the invention, there is provided a method of manufacturing a semiconductor device, comprising the steps of: forming a semiconductor film on a substrate; forming a first conductive film containing refractory metal and nitrogen on the semiconductor film; and heating the first conductive film, thereby changing all or part of the first conductive film to a second conductive film containing nitrogen, the refractory metal, and semiconductor element of the semiconductor film to form at least one of an electrode and a wiring which includes the semiconductor film and second conductive film.

To achieve the third object described above, there are provided a semiconductor devices and a method of manufacturing the device.

According to the sixth aspect of the invention, there is provided a semiconductor device comprising at least one of an electrode and a wiring, comprising: a semiconductor film; a first conductive film formed on the semiconductor film, containing carbon and semiconductor element of the semiconductor film; and a second conductive film formed on the first conductive film. It is desirable that the ratio of carbon atoms in the silicon carbide film range from 50 to 75 atomic %. Also is it preferable that the silicon carbide film contain an electrically active impurity. Further, it is desirable that the silicon carbide film have a thickness of at least 5 nm.

According to the seventh aspect of the invention, there is provided a method of manufacturing a semiconductor device, comprising the steps of: forming a silicon film on a semiconductor substrate; forming a silicon carbide film on the silicon film, the silicon carbide film having a ratio of carbon atoms ranging from 50 to 75 atomic %; forming a metal film on the silicon carbide film; and performing selective anisotropic etching on the silicon film, the silicon carbide film and the metal film, thereby forming at least one of an electrode or a wiring. The silicon carbide film is formed, first by forming a carbon film on the silicon film, and then by implanting ions into the carbon film, thereby mixing carbon atoms and silicon atoms at an interface between the carbon film and the silicon film.

The inventors have found that in the case of a multi-layer electrode made of a silicon film, a film containing nitrogen and silicon, and a refractory point metal, the delay of signal-transfer through the electrode can be much reduced when the contact resistance RC decreases below 100 $\Omega\mu$m$^2$. They also found that the film containing nitrogen and silicon needs to be less than $8 \times 10^{14}$ cm$^{-2}$ in order to obtain a contact resistance of less than 100 $\Omega$cm$^2$. When the first film containing refractory metal and nitrogen and the second film of refractory metal were used in place of a refractory metal film, the same results were obtained as in the case of using a refractory metal film.

Based on their finding, a film containing nitrogen and silicon which has a nitrogen surface density of less than $8 \times 10^{14}$ cm$^{-2}$ is incorporated in the semiconductor devices according to the invention. Due to the low nitrogen surface density, the electrode or the wiring is relatively low, and the delay time thereof is relatively short.

In the method of manufacturing a semiconductor device, according to the present invention, a film containing metal and nitrogen is formed on a silicon film. As described above, the metal contained in the film is such a type that a negative value is obtained by subtracting a decrease in Gibbs free energy occurring in forming a nitride of silicon, from a decrease in Gibbs free energy occurring in forming a nitride of the metal. Therefore, when heat treatment is performed after the the film of the metal has been formed on the film containing the metal and nitrogen, the nitrogen will move from the film into the silicon film and diffuse from the film towards to the metal film. As a result, the film will change to a film of that metal, and a film containing nitrogen and silicon will be formed between the metal film and the silicon film. With this method it is easy to control the surface density of nitrogen of the film containing nitrogen and silicon, to a desired value of less than $8 \times 10^{14}$ cm$^{-2}$. The semiconductor device of this invention can therefore be made easily.

The results of the inventors, research show that when a three-layer film comprised of the silicon film, the conductive film formed on the silicon film and containing nitrogen and silicon and the second conducive film formed on the first conductive film is oxidized, the first conductive film would not be oxidized excessively oxidized. Having the three-layer film, the electrode or wiring used in the semiconductor device is, therefore, free of abnormal oxidation.

Moreover, the results of the inventors' research show that if the first conductive film is an amorphous one, the second conductive film can be one comprised of large crystal grains and, hence, having a low specific resistance. The mechanism of forming large crystal grains may be inferred as follows, though not confirmed yet.

The second conductive film has strain due to the specific crystal structure of the first conductive film on which the second conductive film is formed. Hence, if the first conductive film has different crystal structures at different portions, the second conductive film will have different strains at the portions which are located on said portions of the first conductive film. In the case where the second conductive film has a thickness greater than a particular value, and the strain in it increases over a certain magnitude, there will be formed grain boundaries in the second conductive film. Large crystal grains can no longer be formed. On the other hand, if the first conductive film is amorphous, the second conductive film formed on the first will have no different strains at different portions. However thick the second conductive film is, no grain boundaries will be formed in the second conductive film. Large crystal grains will therefore be formed, reducing the specific resistance of the second conductive film.

In the method of manufacturing a semiconductor device, according to the invention, all or part of said first conductive film is heated and thereby changed to the third conductive film which contains nitrogen, silicon and the refractory metal. The third conductive film, thus formed, is used as a reaction-preventing film. The speed with which the third conductive film is formed depends, but very little, on the heating temperature. In addition, the thickness of the third conductive film depends little on the time of heating. Therefore, the third conductive film can have a large process margin and be processed to have such a size and a shape as designed.

As described above, the electrode or the wiring according to this invention is formed of a metal film, a silicon film and a silicon carbide film interposed between said metal film and said silicon film. Silicon carbide is a substance very stable, both thermally and chemically. Any additive diffuses in a silicon carbide film at a speed about two orders higher than in a silicon film. The silicon carbide film can therefore function as a reaction-preventing film. Furthermore, since the silicon carbide film is a semiconductor, it can make a reaction-preventing film which excels in electrical conductivity. The electrode or wiring according to the invention can therefore be very heat-resistant and have a low resistance. Still further, since selective etching can be performed on the refractory metal film, with respect to the silicon carbide film, the electrode or wiring can have a size and shape as designed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a diagram representing the relationship between the thickness of a silicon nitride film and the contact resistance of the film;

FIG. 3 is a diagram illustrating the relationship between the thickness of a reaction-preventing film and the sheet resistance of a tungsten film;

FIG. 17 is a schematic diagram illustrating a dry etching apparatus.

DETAILED DESCRIPTION OF THE PREFERRED EMBODIMENTS

Embodiments of the present invention will be described, with reference to the accompanying drawings.

First Embodiment

A method of forming a gate electrode which is the first embodiment of the invention, will be described with reference to FIGS. 1A to 1D.

Figure 1A:
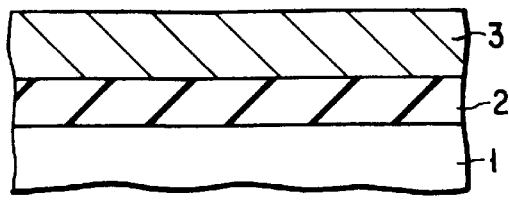
FIGS. 1A to 1D are sectional views, explaining a method of forming a gate electrode which is the first embodiment of the present invention.

First, as shown in FIG. 1A, a silicon oxide film 2 is formed on a silicon substrate 1. Then, a polycrystalline silicon film 3 is formed on the silicon oxide film 2. The film 3 is 100 nm thick and contains an electrically conductive impurity. The oxide film naturally formed on the polycrystalline silicon film 3 is removed.

Figure 1B:
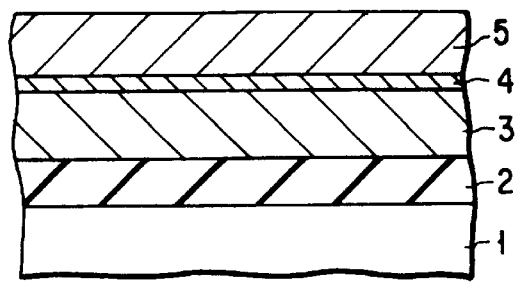

Next, as shown in FIG. 1B, a tungsten nitride film 4 (e.g., $W_2N$ or WN film) having a thickness of 10 nm is formed on the polycrystalline silicon film 3 by means of reactive sputtering in an atmosphere which consists of $N_2$ gas and Ar gas mixed together in the ratio of 3:2. A tungsten film 5, 100 nm thick, is then formed on the tungsten nitride film 4 by sputtering conducted in an Ar atmosphere. The sputtering for forming the tungsten nitride film 4 and the sputtering for forming the tungsten film 5 should preferably be continuously performed in the order mentioned, without exposing the tungsten nitride film 4 to the atmosphere. Alternatively, the films 4 and 5 may be deposited on the polycrystalline silicon film 3 immediately after the film 3 has been formed, so that the film 3 may not be exposed to the atmosphere and an oxide film may not be formed on the film 3.

Figure 1C:
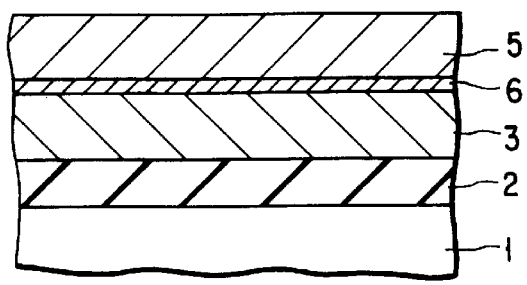

Then, as shown in FIG. 1C, the structure shown in FIG. 1B is heated at about 750 to 1000° C. in an inert gas atmosphere, a non-oxidizing atmosphere such as a reducing atmosphere (e.g., a nitrogen atmosphere, an argon atmosphere, a hydrogen atmosphere, or an atmosphere of nitrogen, argon and hydrogen mixed together). A part of the nitrogen in the tungsten nitride film 4 is distributed into the polycrystalline silicon film 3, forming a nitrogen-rich film in the upper surface of the polycrystalline silicon film 3. The nitrogen-rich silicon shall be referred to as "silicon nitride ($SiN_x$) film 6" hereinafter. The silicon nitride film 6, thus formed, can have a thickness of 1 nm or less. In fact, silicon nitride films actually formed in this method were found to have a thickness ranging from about 0.2 to about 1 nm, when measured by X-ray Photoelectron spectroscopy.

While said part of the nitrogen in the film 4 moves into the film 3, thus forming the silicon nitride film 6, the remaining nitrogen in the film 4 diffuses outwards from the film 4. As a result, the tungsten nitride film 4 changes to a tungsten film and subsequently becomes integral with the tungsten film 5.

Why a part of of nitrogen moves from the tungsten nitride film 4 into the polycrystalline silicon film 3 will be explained. Gibbs free energy decreases when tungsten nitride is formed from tungsten. This decrease in Gibbs free energy is less than the decrease in Gibbs free energy which accompanies the forming of silicon nitride from silicon. It follows that as long as the tungsten nitride film 4 contacts the polycrystalline silicon film 3, nitrogen in the film 4 has a chemical potential higher than that of the polycrystalline silicon film 3. Hence, nitrogen moves from the tungsten nitride film 4 into the polycrystalline silicon film 3.

As described above, the remaining nitrogen in the film 4 diffuses out of the film 4. This is because Gibbs free energy, which has been decreasing, starts increasing, whereby the nitrogen diffuse outwards to achieve thermodynamic equilibrium.

If a native oxide film has been formed on the surface of the polycrystalline silicon 3, the tungsten nitride film 4 and the tungsten film 5 may be deposited on this oxide film, and the resultant structure may be heat-treated in the manner described above. Then, a silicon nitride ($SiO_xN_y$) film containing oxygen diffused from the native oxide film will be formed instead of the silicon nitride ($SiN_x$) film 6.

Figure 1D:
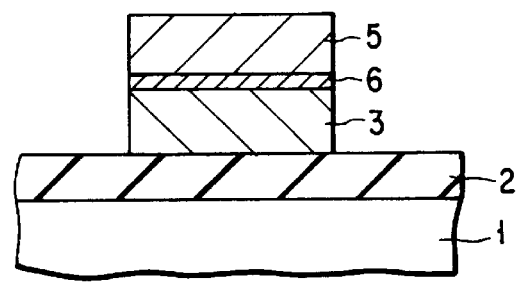

Finally, as shown in FIG. 1D, the tungsten film 5, the silicon nitride film 6 and the polycrystalline silicon film 3 are patterned by etching. A gate electrode is thereby provided.

Figure 13:
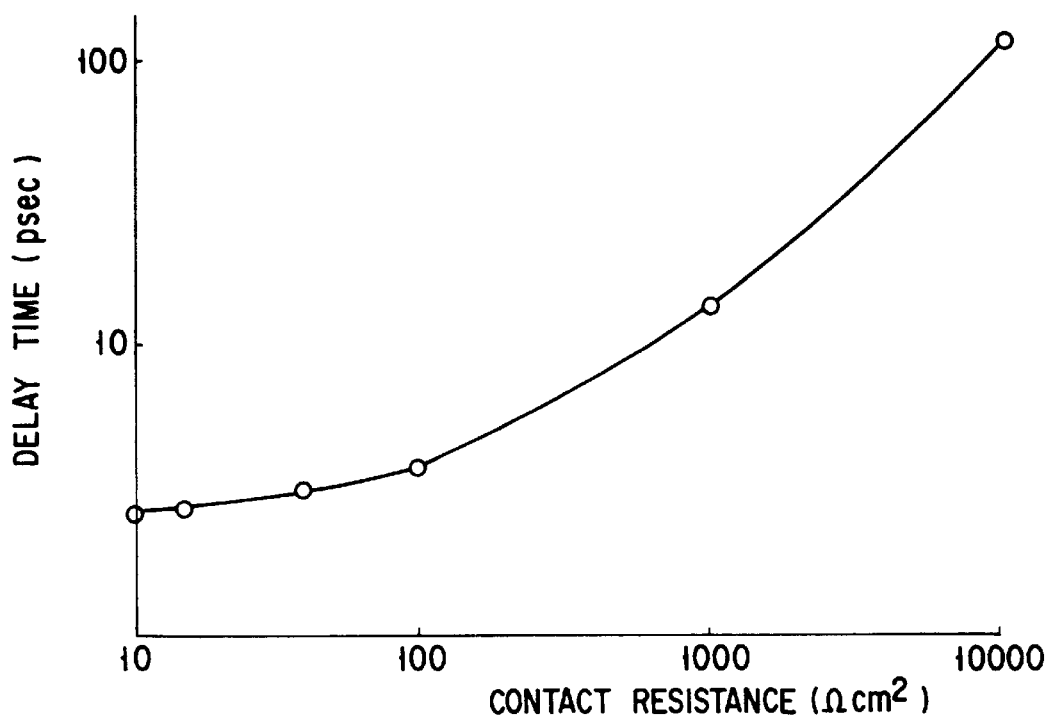
FIG. 13 is a graph indicating the relationship between delay time and contact resistance.

FIG. 13 is a graph indicating the relationship between delay time and contact resistance, which the inventors of this invention have found based on their experiments. As evident from FIG. 13, the delay time sharply changes at the contact resistance of 100 $\Omega cm^2$. The delay of signal transfer through the gate electrode can be greatly reduced by decreasing the contact resistance to a value less than 100 $\Omega cm^2$.

The contact resistance of the silicon nitride film 6 and the thickness thereof have the relationship shown in FIG. 2. In FIG. 2, the curve a indicates how the contact resistance changes with the thickness of the film 6 in the case where the polycrystalline silicon film 3 has a high n-type impurity concentration. On the other hand, the curve b shows how the contact resistance changes with the thickness of the film 6 in the case where the film 3 has a high p-type impurity concentration.

FIG. 2 teaches two things. First, in the case where the polycrystalline silicon film 3 has a high p-type impurity concentration, the surface density of nitrogen at the interface between the tungsten film 5 and the silicon nitride film 6 needs to be less than $8 \times 10^{14}$ $cm^{-2}$ (equivalent to less than 1 nm in terms of the thickness of the film 6) in order to obtain a contact resistance of less than 100 $\Omega cm^2$. Secondly, the contact resistance of the film 6 greatly changes at the nitrogen surface density of $8 \times 10^{14}$ $cm^{-2}$ and can be much reduced by setting the that density at a value less than $8 \times 10^{14}$ $cm^{-2}$.

As described above, the method of forming a gate electrode according to the invention can set the surface density of nitrogen at the interface between the films 5 and 6 at a value less than $8 \times 10^{14}$ $cm^{-2}$. Therefore, the silicon nitride film 6 can be made thin enough to reduce have its contact resistance reduced, whereby the delay of signal transfer through the gate electrode can be decreased.

FIG. 3 is a graph illustrating the relationship which the nitrogen interface density of a gate electrode consisting of a polycrystalline silicon film, a reaction-preventing film and a tungsten film has with the sheet resistance the tungsten film having a thickness of 100 nm exhibits after the gate electrode has been heated in an $N_2$ atmosphere at 800° C. for one hour. More precisely, FIG. 3 shows the relationship between the nitrogen interface density of a gate electrode consisting of a polycrystalline silicon film, a reaction-preventing film of $SiN_x$ or $SiO_xN_y$, and a tungsten film and the sheet resistance of the tungsten film, and also indicates the relationship between the thickness of the reaction-preventing film of $SiN_x$ or $SiO_xN_y$ and a tungsten film and the sheet resistance of the tungsten film.

As can be understood from FIG. 3, if the reaction-preventing film is made of $SiN_x$ or $SiO_xN_y$ as in the first embodiment of the invention, the sheet resistance of the tungsten film remains sufficiently low (equivalent to 0.3 nm in terms of the thickness of the $SiN_x$ film) at a nitrogen interface density of $2.2 \times 10^{14}$ cm$^{-2}$ and upwards. Hence, the silicon nitride film 6 (i.e., the reaction-preventing film) greatly mitigates the influence of the heat treatment.

In contrast, if the reaction-preventing film is made of $SiO_2$ as in the conventional process of forming silicon gates and has a thickness of 2 nm or less, the sheet resistance of the tungsten film will increase as evident from FIG. 3. This is because the tungsten film and the polycrystalline silicon film react with each other, inevitably forming silicide.

In the method of forming a gate electrode according to the invention, the polycrystalline silicon film 2 may be slightly nitrided, forming a very thin silicon nitride film—due to the plasma generated in the process atmosphere as the tungsten nitride film 4 is formed by sputtering. This silicon nitride film can be used as a reaction-preventing film, in addition to the silicon nitride film which has been formed by the nitrogen distribution from the tungsten nitride film 4.

Figure 4A:
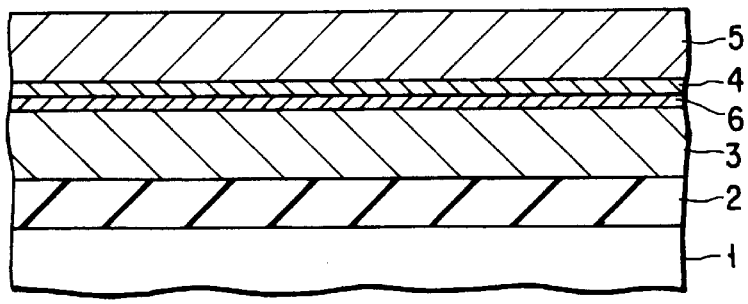
FIGS. 4A and 4B are sectional views for explaining two modifications of the method two modifications of the gate electrode according to the first embodiment.

In the method of forming the gate electrode which is the first embodiment, the tungsten nitride film 4 is changed, as a whole, into a tungsten film. Alternatively, as shown in FIG. 4A, only a portion of the tungsten nitride film 4 may be changed into a tungsten film. In this case, the thickness of that portion of the film 4 depends on the thickness of the silicon nitride film 6 required.

Figure 4B:
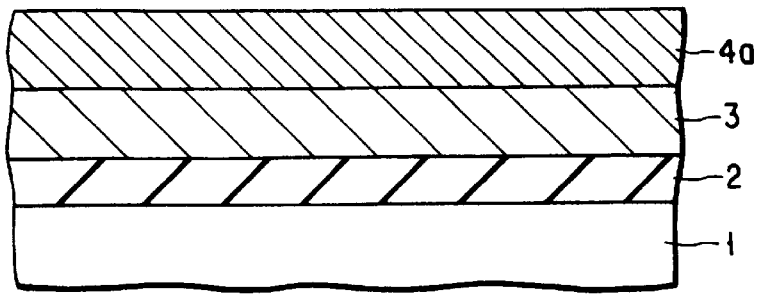

Furthermore, as shown in FIG. 4B, a relatively thick tungsten nitride film 4a may be formed on the polycrystalline silicon film 3, thereby to obtain the structure illustrated in FIG. 1C. More specifically, after the step explained with reference to FIG. 1A, a tungsten nitride film 4a about 100 nm thick is formed on the polycrystalline silicon film 3 by sputtering in an atmosphere containing nitrogen, excited nitrogen or ionized nitrogen. Next, the resultant structure is heat-treated in a non-oxidizing atmosphere such as a reducing atmosphere, as in the method of forming the first embodiment. The nitrogen therefore moves from the tungsten nitride film 4a into the polycrystalline silicon film 3, forming a silicon nitride film which has a thickness of about 1 nm, i.e., about one-atom layer thickness. At the same time, the nitrogen diffuses outwards from the film 4a, whereby the tungsten nitride film 4a becomes a tungsten film. As a result, the structure of FIG. 1C is obtained.

In the first embodiment, the films 3, 5 and 6 of the structure shown in FIG. 1C are patterned into a gate electrode after the nitrogen has been distributed into the polycrystalline silicon film 3 and diffused outwards from the tungsten nitride film 3. If the patterning is effected by anisotropic etching, the ratio of etching rate of the tungsten film 5 to that of the polycrystalline silicon film 3 may change as the tungsten grains grow as the heat treatment proceeds. To avoid such changes in the ratio of etching rates, it suffices to perform the patterning first and then the heat treatment to distribute and diffuse the nitrogen from the tungsten nitride film 4. This heat treatment for forming the tungsten nitride film 4 may be replaced by other heat treatment to be performed later, for example, the heat treatment for activating the impurity in a source diffusion layer or a drain diffusion layer.

Second Embodiment

A method of forming a gate electrode which is the second embodiment of the invention, will be described with reference to FIGS. 5A, 5B and 5C.

Figure 5A:
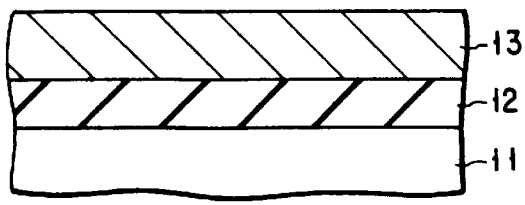
FIGS. 5A to 5C are sectional views, explaining a method of forming a gate electrode which is the second embodiment of the present invention.

First, as shown in FIG. 5A, a silicon oxide film 12 is formed on a silicon substrate 11. Then, a polycrystalline silicon film 13 having a thickness of 100 nm is formed on the silicon oxide film 12.

Figure 5B:
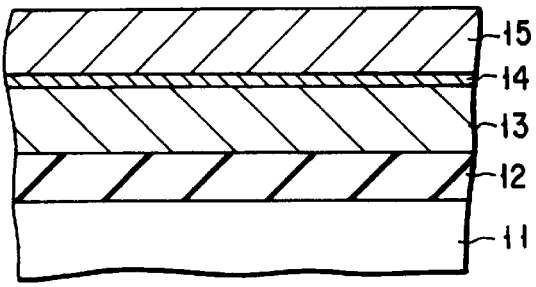

Next, as shown in FIG. 5B, a silicon nitride film 14 having a small thickness of less than 1 nm, preferably about 0.7 nm, is formed as a reaction-preventing film on the polycrystalline silicon film 13. It is desirable that the thin silicon nitride film 14 be formed by one of the following five alternative methods:

(1) Thermal nitriding performed in an NH3 atmosphere at 1000° C. for 30 seconds
(2) Plasma nitriding conducted in an atmosphere containing nitrogen
(3) Thermal CVD effected at 600 to 800° C., using $SiH_2Cl_2+NH_2$ or $SiH_4+NH_3$ as source gas
(4) Plasma CVD method
(5) Method wherein plasma (N2/N2 or NH3) is generated remote from the substrate heated at from 500 to 800° C., and active species of plasma are carried to the substrate in a down flow Thereafter, a tungsten film 15, 100 nm thick, is formed on the silicon nitride film 14 by means of sputtering.

Figure 5C:
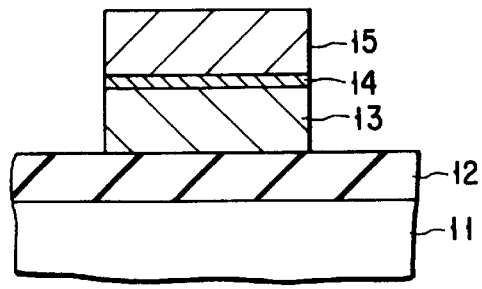

Finally, as shown in FIG. 5C, the tungsten film 15, the silicon nitride film 14 and the polycrystalline silicon film 13 are patterned by etching. A gate electrode is thereby provided.

The gate electrode thus formed is as thin as that one provided by the method according to the first embodiment, and can therefore achieve the same advantages as the gate electrode according to the first embodiment.

Both the first embodiment and the second embodiment are gate electrodes. Nonetheless, the present invention can be applied to any other type of an electrode and a wiring.

Third Embodiment

Figure 6:
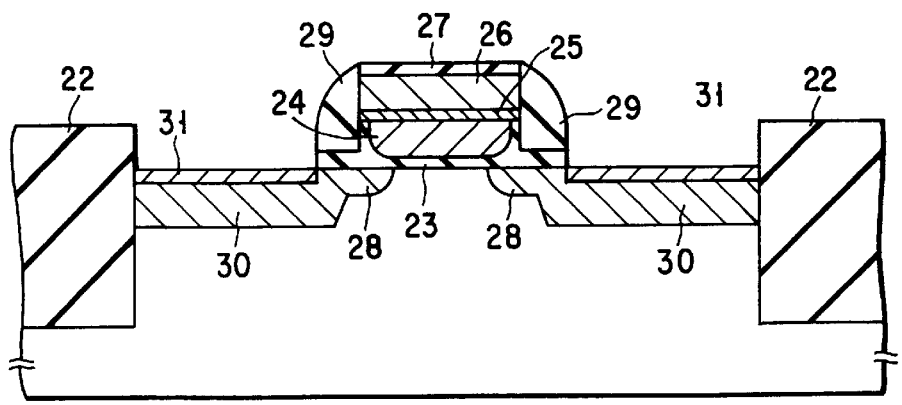
FIG. 6 is a sectional view of a MOSFET which is the third embodiment of the invention.

FIG. 6 is a sectional view of a MOSFET which is the third embodiment of the present invention. The method of manufacturing this MOSFET will be described.

First, an insulating film 22 is formed in the surface of a silicon substrate 21, for isolating elements which will be formed later. A gate oxide film 23 is then formed on the exposed surface of the silicon substrate 21. Further, a polycrystalline silicon film 24 is formed on the gate oxide film 23, a silicon nitride film 25 is formed on the film 24, and a tungsten film 26 is formed on the film 25. The films 24, 25 and 26 constitute a three-layer film. The silicon nitride film 25 is thin enough to have as low a contact resistance as possible, in order to decrease the delay of signal transfer through the MOSFET as much as possible.

Next, a silicon nitride (SiN) film 27 is formed on the tungsten film 26. This silicon nitride film 27 serves as a cap-insulating film. The silicon nitride film 27 is formed by LPCVD method in a process chamber, using as source gases $NH_3$ gas and inorganic silane-based gas $SiH_2Cl_2$, as usual. If $NH_3$ and $SiH_2Cl_2$ are introduced together into the process chamber, the surface of the tungsten film 26 will be nitrided not uniformly, and silicon nitride will grow in the form of granules, and the film 27 may fail to function as a cap-insulating film. To avoid this consequence it is advisable to introduce only $SiH_2Cl_2$ into the chamber, thereby to form a thin, silicon-containing film on the tungsten film 26, and then to introduce both $NH_3$ and $SiH_2Cl_2$ are into the process chamber. When this two-stage gas introduction was performed, the surface of a tungsten film was nitrided uniformly, successfully forming a homogeneous silicon nitride film which corresponds to the film 27.

Then, the three-layer film comprised of the polycrystalline silicon film 24, the silicon nitride film 25 and the tungsten film 26 is patterned by etching, thereby forming a gate electrode. $N_2$ gas and an $H_2$—$H_2O$ mixture gas are applied to the resultant structure, oxidizing only the polycrystalline silicon layer 24 and the silicon substrate 21. The oxide film on the gate electrode therefore becomes thick at the end portions of the gate electrode. This makes the gate electrode work reliably even if electric fields are concentratedly applied to the ends of the gate electrode.

Next, an impurity is ion-implanted into the substrate 21, thus forming two low impurity-concentration diffusion layers 28 (i.e., a source-drain region). A silicon nitride film 29 is then formed, which serves as an insulating film covering the sides of the gate electrode. The film 29 may be formed in the same way as the silicon nitride film 27 which is used as a cap-insulating film.

The silicon nitride films 27 and 29 completely cover the gate electrode constituted of the polycrystalline silicon film 24, the silicon nitride film 25 and the tungsten film 26. Therefore, the tungsten film 26 is free from oxidation in the oxidation which will be subsequently conducted in an oxidizing atmosphere. Further, when a wiring made of electrically conductive material including copper (Cu) is formed the structure of FIG. 6, the silicon nitride films 27 and 29 prevent the copper from diffusing into the gate electrode. Still further, since the films 27 and 29 cooperate to wrap, as it were, the films 24, 25 and 26 together, the polycrystalline silicon film 24 and the silicon nitride film 25 are firmly bonded to each other.

Finally, a diffusion layer 30 having a high impurity concentration is formed in the surface of the silicon substrate 21, and a metal silicide film 31 is formed on the diffusion layer 30. Thus manufactured is the MOSFET of the structure illustrated in FIG. 6.

Fourth Embodiment

Figure 7:
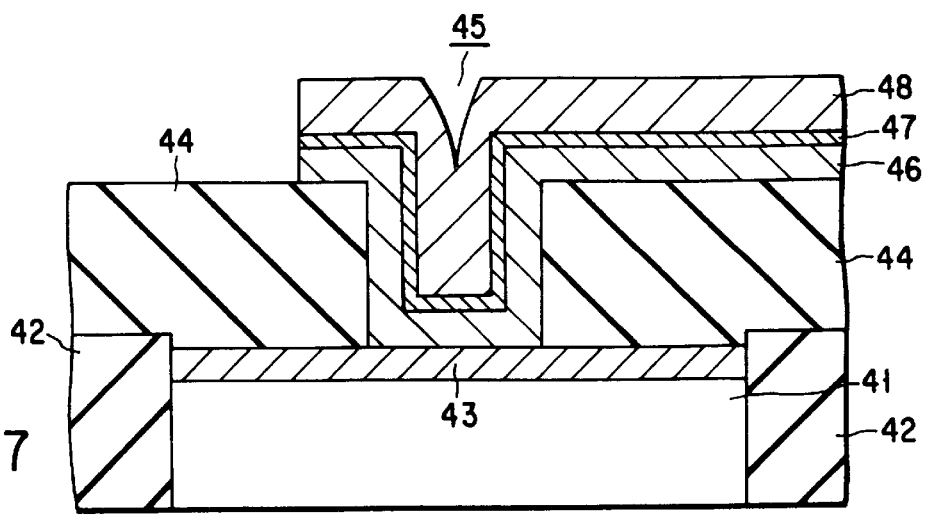
FIG. 7 is a sectional view showing a wiring which is the fourth embodiment of the present invention.

FIG. 7 is a sectional view showing a wiring which is the fourth embodiment of the invention. With reference to FIG. 7 it will be explained how the wiring is formed.

At first, an insulating film 42 for isolating elements and an impurity diffusion layer 43 are formed in the surface of a silicon substrate 41. Then, an $SiO_2$ film 44 is formed on the entire upper surface of the resultant structure. The $SiO_2$ film 44 is about 600 nm thick and functions as an inter-layer insulating film. A contact hole 45 is made in the $SiO_2$ film 44, thereby exposing the impurity diffusion layer 43. Next, a polycrystalline silicon film 46, about 100 nm thick, is formed in the contact hole 45 and on the $SiO_2$ film 44. Further, a thin silicon nitride film 47 is formed on the polycrystalline silicon film 46, and a tungsten film 48 having a thickness of about 100 nm is formed on the silicon nitride film 47. The films 46, 47 and 48 constitute a three-layer film, which may be formed by any method described above. Finally, the three-layer film thus formed is patterned by etching, thereby forming the wiring shown in FIG. 7.

Made relatively think, the silicon nitride film 47 has a low contact resistance. The delay of signal transfer through the wiring is therefore short.

Fifth Embodiment

FIGS. 8A to 8D are sectional views which explain a method of forming a gate electrode which is the fifth embodiment of this invention. with reference to FIGS. 8A to 8D it will be described how this gate electrode is formed.

Figure 8A:
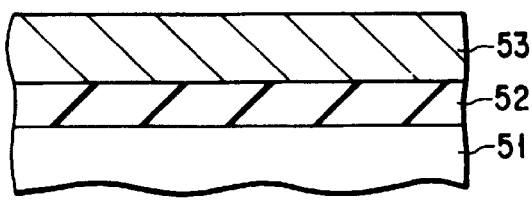
FIGS. 8A to 8D are sectional views, explaining a method of forming a gate electrode which is the fifth embodiment of this invention.

First, as shown in FIG. 8A, a silicon oxide film 52 used as a gate-insulating film is formed on a silicon substrate 51. A polycrystalline silicon film 53 having a thickness ranging from 1 nm to 10 nm is formed on the silicon oxide film 52.

Figure 8B:
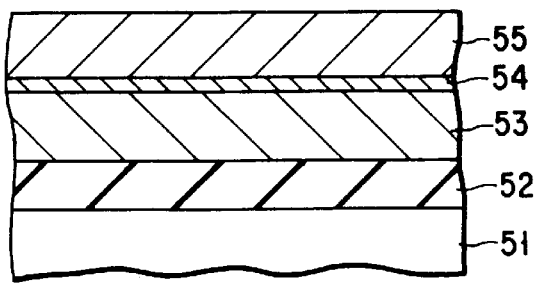

Next, as shown in FIG. 8B, a tungsten nitride film 54, about 1 to 10 nm thick, is formed on the polycrystalline silicon film 53. A tungsten film 55, 10 nm thick, is formed on the tungsten nitride film 54. To state more specifically, reactive sputtering is carried out, using a tungsten target in an atmosphere, thereby forming the tungsten nitride film 54 on the film 53. Thereafter, $N_2$ gas is expelled from the process chamber used, and sputtering is then performed in the chamber now containing Ar. The tungsten film 55 is thereby formed in a vacuum, without exposing the tungsten nitride film 54 to the atmosphere.

Alternatively, both the tungsten nitride film 54 and the tungsten film 55 can be formed by means of CVD method. If this is the case, the tungsten nitride film 54 is formed at 500 to 700° C., using a mixture gas, $WF_6+NF_3$, as source gas, and the tungsten film 55 is formed at 400 to 500° C., using a mixture gas, $WF_6+H_2$, as source gas.

Figure 8C:
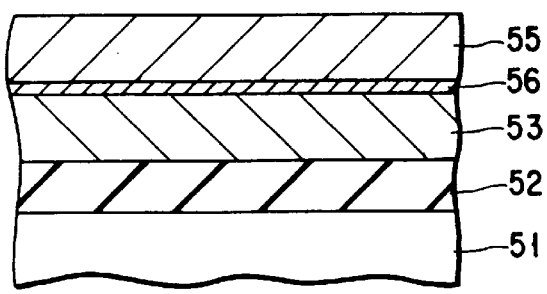

Thereafter, as shown in FIG. 8C, the resultant structure is subjected to heat treatment for 30 minutes at 800° C. or more in a reducing atmosphere containing hydrogen. The tungsten nitride film 54 is thereby changed into a reaction-preventing film 56 which consists of tungsten (W), silicon (Si) and nitrogen (N) (W:Si:N=1:3:1–1:4:1, for example) and which has a thickness of 1 nm or less. Since the heat treatment is effected in a reducing atmosphere, the tungsten film 55 remains free of oxidation.

How the reaction-preventing film 56 is formed will be explained. During the heat treatment, part of the nitrogen in the tungsten nitride film 54 leaks outside through the tungsten film 55 and diffuses into the polycrystalline silicon film 53, forming a tungsten film, which becomes integral with the tungsten film 55. Meanwhile, part of the tungsten nitride film 54 diffuses into the polycrystalline silicon film 53, whereas part of the polycrystalline silicon film 54 diffuses into the tungsten nitride film 54. As a result, the reaction-preventing film 56 is formed, which consists of tungsten, silicon and nitrogen.

The reaction-preventing film 56 may contain the oxygen derived from the oxide film naturally formed on the polycrystalline silicon film 53. Even if this happens, the barrier at the interface between the polycrystalline silicon film 53 and the tungsten film 55 remain intact.

The reaction-preventing film 56 can easily be formed as designed, for reasons stated above in Summary of the Invention. Being electrically conductive, the film 56 has but a low contact resistance with the polycrystalline silicon film 53, and also with the tungsten film 55. When put to cross-section TEM observation and EDX analysis, the film 56 was found to made up of 20% of tungsten, 60% of silicon, and 20% of nitrogen.

Figure 8D:
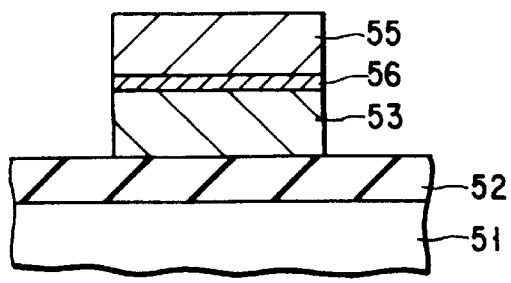

At last, as shown in FIG. 8D, the three-layer film formed of the polycrystalline silicon film 53, the reaction-preventing film 56 and the tungsten film 55 is patterned into a gate electrode.

The polycrystalline silicon film 53 has a thickness of, in most cases, 0.5 to 0.2 $\mu$m. An impurity, either $n^+$ (As,P) or $p^+$ (B), is introduced into the polycrystalline silicon film 53 by means of ion implantation or vapor-phase diffusion, while the film 53 is being vapor-deposited or after the film 53 has been vapor-deposited. In order to impart different work functions to the gates the p-channel and n-channel transistors constituting the CMOS-FET, B may be introduced into the gate of the p-channel transistor, and P or As may be introduced into the gate of the n-channel transistor. Alternatively, a film 53 of amorphous silicon containing B or polycrystalline silicon containing B may first be formed, P or As may then be introduced into that part of the film 53 which is the gate of the n-channel transistor, such that this part has an P or As concentration higher than the B concentration.

In the case where an impurity is ion-implanted into the polycrystalline silicon film 53, ions $B^+$ are implanted into the film 53 at 1 to 20 keV, ions $P^+$ are implanted at 5 to 30 keV, or the ions $As^+$ are implanted at 10 to 50 kev, at a dose which ranges from $5 \times 10^{14}$ $cm^{-2}$ to $5 \times 10^{15}$ $cm^{-2}$ in accordance with the thickness of the polycrystalline silicon film 53. Thereafter, the polycrystalline silicon film 53 is heated, thereby electrically activating the impurity.

In order to change the work function of the polycrystalline silicon (particularly, B-doped silicon), germanium (Ge) is ion-implanted in to the film 53 at 10 to 40 kev at a dose of $1 \times 10^{15}$ to $5 \times 10^{16}$ $cm^{-2}$, thereby to form a Ge-containing film of polycrystalline silicon. Alternatively, the polycrystalline silicon film may be replaced by a germanium film. Furthermore, the polycrystalline silicon film may be replaced by a single-crystal silicon substrate or an SOI single-crystal layer, which exhibits thermal stability as high as that of the polycrystalline silicon film. To reduce the contact resistance with electrodes, germanium may be ion-implanted into the a single-crystal silicon substrate or an SOI single-crystal layer (for example, into the source and drain regions, particularly into the source region), at a dose of $1 \times 10^{15}$ to $5 \times 10^{16}$ $cm^{-2}$. In this case, too, the advantage resulting from the use of barrier metal is attained.

Sixth Embodiment

Figure 9:
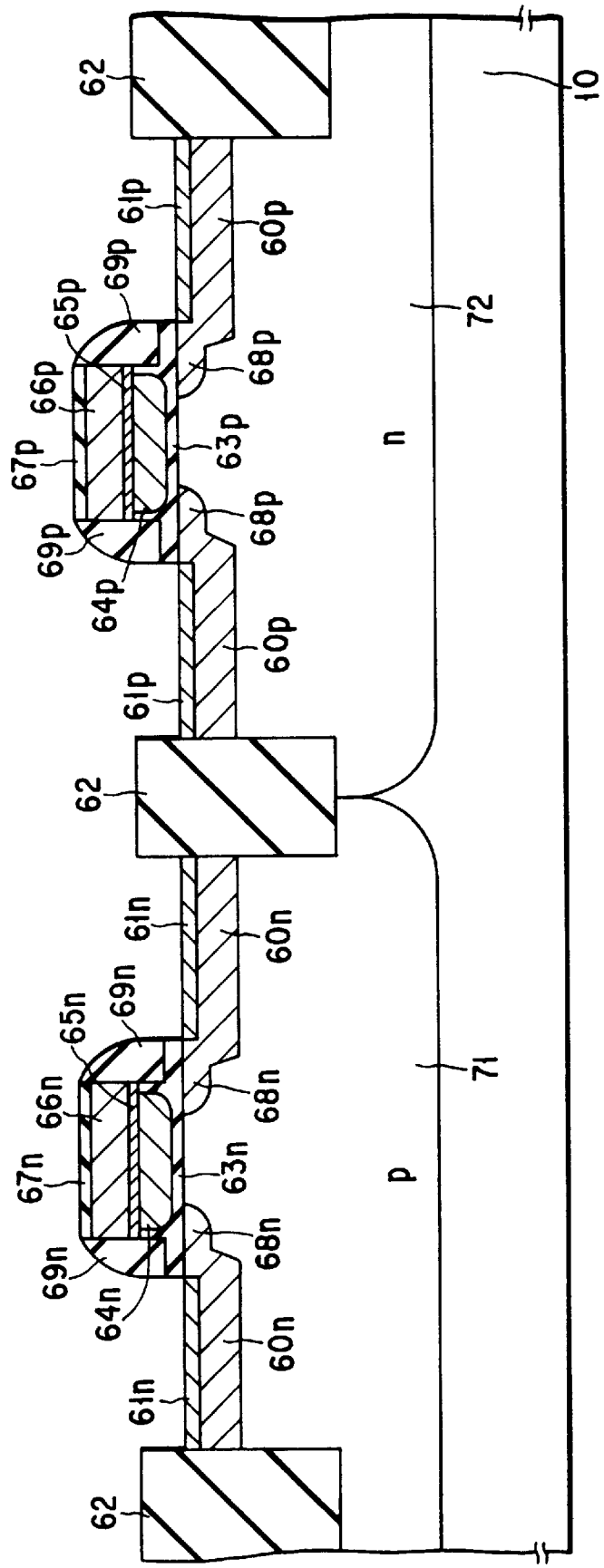
FIG. 9 is a sectional view depicting a MOSFET which is a sixth embodiment of this invention.

FIG. 9 is a sectional view depicting a MOSFET which is a sixth embodiment of the present invention. With reference to FIG. 9, the method of manufacturing the MOSFET will be explained.

First, an insulating film 62, used as an element-isolating film, is formed in the surface of a silicon substrate 70, demarcating the surface region of the substrate 70 into element-forming regions. Then, an n-type well layer 71 and an n-type well layer 72 are formed two element-forming regions of the substrate 70, respectively. An n-type MOS transistor will be formed in the p-type well layer 71, and a p-type MOS transistor will be formed in the n-type well layer 72.

Next, a gate oxide film 63p is formed on the p-type well layer 71,and a gate oxide film 63p on the n-type well layer 72. A polycrystalline silicon film 64n containing an n-type impurity is formed on the gate oxide film 63n. A polycrystalline silicon film 64p containing a p-type impurity is formed on the gate oxide film 63p.

Further, reaction-preventing films 65n and 65p, each formed of nitrogen, tungsten and silicon, are formed on the polycrystalline silicon films 64n and 64p, respectively. Two tungsten films 66n and 66p are then formed on the reaction-preventing films 65n and 65p, respectively. Further, two silicon nitride (SiN) films 67n and 67p are formed on the tungsten films 66n and 66p, respectively. The silicon nitride films 67n and 67p each serve as a cap-insulating film.

Both reaction-preventing films 65n and 65p are formed in the same way as in the method of forming the gate electrode which is the fifth embodiment. Even if oxide films are naturally formed on the polycrystalline silicon films 64n and 64p during the process of forming the films 65n and 65p, the barrier at the interface between the film 64n and tungsten film 66n remains intact, and so does the barrier at the interface between the film 64p and the tungsten film 66p.

Then, the polycrystalline silicon film 64n, the reaction-preventing film 65n, the tungsten film 66n and the silicon nitride film 67n are etched, forming the gate electrode of the n-type MOS transistor. At the same time, the polycrystalline silicon film 64p, the reaction-preventing film 65p, the tungsten film 66p and the silicon nitride film 67p are etched, forming the gate electrode of the p-type MOS transistor.

Thereafter, the silicon contained in the polycrystalline silicon films 64n and 64p, p-type well layer 71 and n-type well layers 72 are oxidized by using $N_2$ gas and a mixture of $H_2$ gas and $H_2O$ gas. This oxidation is effected by the method disclosed in Jpn. Pat. Appln. KOKAI Publication No. 60-9166. The oxide film on either gate electrode becomes thick at both end portions of the gate electrode. Hence, either gate electrode works reliably even if electric fields are concentratedly applied to the ends of the gate electrode.

In the present embodiment, the reaction-preventing films 65n and 65p are made of the nitride of the same metal used as a component of the gate electrodes. The films 65n an 65p are therefore reliably prevented from being oxidized excessively when the silicon they contain is oxidized. This is a new fact the inventors have come across. The reason why an excessive etching of the films 65n and 65p is prevented has yet to be studied. Needless to say, the films 65n and 65p may be made of the nitride of a metal different from the metal used as a component of the gate electrodes.

The above-mentioned metal is preferably such one as will reduce metal nitride in any subsequent heat treatment conducted in a reducing atmosphere. In the present embodiment, the metal is tungsten, and the metal nitride is tungsten nitride.

Tungsten nitride can be amorphous, depending on its nitrogen content. In the present embodiment, the reaction-preventing films 65n and 65p contain 5 to 20% of nitrogen and are amorphous. The film 65n efficiently prevents reaction between the polycrystalline silicon film 64n and the tungsten film 66n. The film 65p reliably prevents reaction between the polycrystalline silicon film 64p and the tungsten film 66p. Since the reaction-preventing films 65n and 65p are amorphous, the grains of the tungsten films 65n and 65p formed on the films 65n and 65p, respectively, are large. Therefore, both tungsten films 65n and 65p have a low specific resistance.

After the silicon in the polycrystalline silicon films 64n and 65p, p-type well layer 71 and n-type well layer 72 has been oxidized as indicated above, impurities are ion-implanted into the layer 71, forming shallow, low impurity-concentration source and drains regions 68n, and into the layer 72, forming shallow, low impurity-concentration source and drain regions 68p. Then, silicon nitride films 69n and 69p are formed. The film 69n covers the sides of the first gate electrode, and the silicon nitride film 69n covers the top of the first gate electrode; the film 69p covers the sides of the second gate electrode, and the silicon nitride film 69p covers the top of the second gate electrode. The tungsten films 66n and 66p have their sides covered by the silicon nitride films 69n and 69p, respectively, and will not be oxidized in any subsequent process step.

Finally, impurities are ion-implanted into the p-type well layer 71, thereby forming source and drain regions 60n in the well layer 71. Similarly, impurities are ion-implanted into the n-type well layer 72, thereby forming source and drain regions 60p in the well layer 72 and from metal silicides 61n, 61p on the regions 60n, 60p. The COMS transistor of the structure shown in FIG. 9 is thereby manufactured.

The inventors hereof have found that if a titanium nitride film is used as a reaction-preventing film, the following two problems will arise.

Figure 14A:
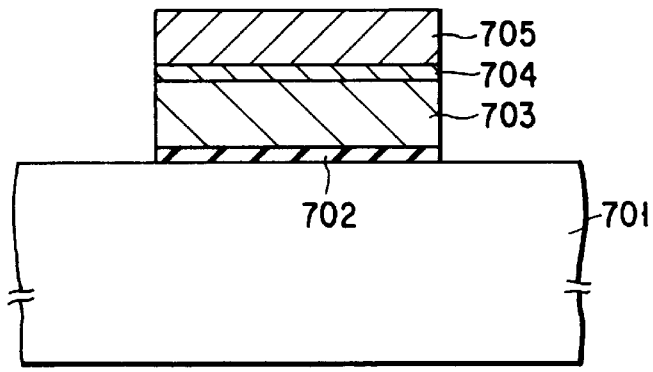
FIGS. 14A and 14B are sectional views of a gate electrode, for explaining how the titanium nitride, a component of the electrode, is oxide abnormally.
Figure 14B:
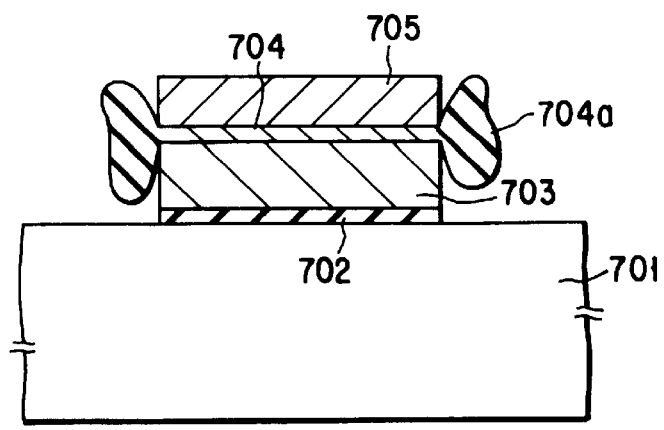

First, the reaction-preventing film is oxidized excessively since titanium nitride is very readily oxidized. This problem will be described, with reference to FIGS. 14B and 14B. FIG. 14A is a sectional view of a gate electrode formed on a silicon substrate 701. The gate electrode is comprised of a gate oxide film 702 formed on the silicon substrate 701, a polycrystalline silicon film 703 formed on the film 702, a titanium nitride film 704 formed on the film 703 and a tungsten film 705 formed on the film 704. When selective etching of silicon is performed in order to increase the thickness of the end portions of the oxide film (not shown) formed on the gate electrode, the titanium nitride film 704 is excessively oxidized at its sides, forming titanium oxide ($TiO_2$) bumps 704a having a diameter of about 10 to 100 nm. These titanium oxide bumps 704a make it difficult to form a homogeneous insulating film (e.g., a silicon oxide film or a silicon nitride film) on the silicon substrate 701 by means of CVD method.

The second problem is that the titanium nitride grains formed on a polycrystalline silicon film are small. The tungsten film subsequently formed on the titanium nitride film formed of these small grains inevitably has a high specific resistance.

In order to solve these problems, each reaction-preventing film of the present embodiment is made of the nitride of the same metal used as a component of the gate electrode, as is described above.

Seventh Embodiment

A gate electrode which is the seventh embodiment of the present invention will be described. It will be explained how to form this gate electrode, with reference to FIGS. 10A to 10D.

Figure 10A:
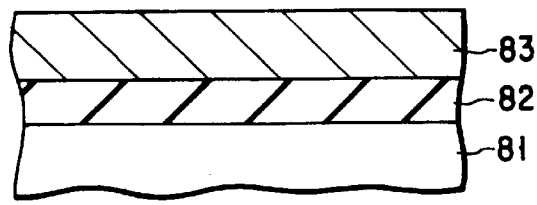
FIGS. 10A to 10D are sectional views for explaining a method of forming a gate electrode which is the seventh embodiment of the present invention.

First, as shown in FIG. 10A, a silicon oxide film 82, used as a gate oxide film, is formed on a silicon substrate 81. A polycrystalline silicon film 83 having a thickness of 100 nm and containing a conductive impurity is formed on the silicon oxide film 82.

Figure 10B:
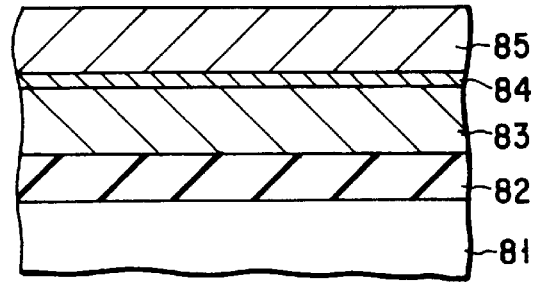

Then, as illustrated in FIG. 10B, a molybdenum nitride film 84 having a thickness of 1 to 10 nm is formed on the polycrystalline silicon film 83, and a molybdenum film 85 having a thickness of 10 nm is formed on the molybdenum film 85. More precisely, reactive sputtering is conducted, using a molybdenum target, thus forming the molybdenum nitride film 84 on the polycrystalline silicon film 83. $N_2$ gas is expelled from the process chamber used, and sputtering is then performed in the chamber now filled with Ar only. The molybdenum film 85 is thereby formed, without exposing the substrate 81 to the atmosphere.

Figure 10C:
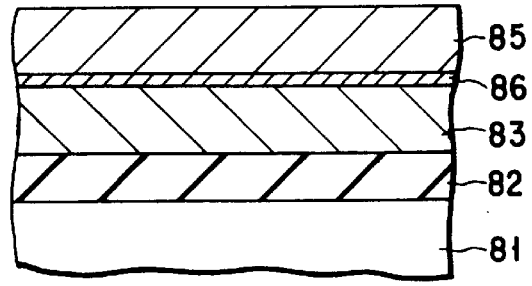

Next, as shown in FIG. 10C, the resultant structure is subjected to heat treatment for 30 minutes at 800° C. or more in a reducing atmosphere containing hydrogen. The molybdenum nitride film 84 is thereby changed into a reaction-preventing film 56 which consists of molybdenum, silicon and nitrogen and which has a thickness of 1 nm or less. Since the heat treatment is carried out in a reducing atmosphere, the molybdenum film 85 remains free of oxidation.

The reaction-preventing film 86 can easily be formed as designed, as is achieved in the fifth embodiment. Being electrically conductive, the film 86 has but a low contact resistance with the polycrystalline silicon film 83, and also with the molybdenum film 85.

Figure 10D:
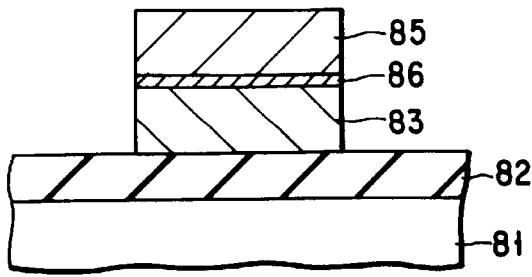

At last, as shown in FIG. 10D, the three-layer film formed of the polycrystalline silicon film 83, the reaction-preventing film 86 and the molybdenum film 85 is patterned into a gate electrode.

In the embodiment described above, including the seventh embodiment, the multi-layer film is patterned after the reaction-preventing film has been formed. Instead, the reaction-preventing film may be formed after the multi-layer film has been patterned.

The present invention has been made to solve a problem caused by a silicon nitride film interposed between a polycrystalline silicon film and a refractory metal film. Namely, due to the silicon nitride film (i.e., a reaction-preventing film), the contact resistance between the polycrystalline silicon film and the metal film increases to lengthen the delay time of the semiconductor element which incorporates the polycrystalline silicon film and the refractory metal film. This problem will be described in detail, with reference to FIGS. 11A and 11B.

Figure 11A:
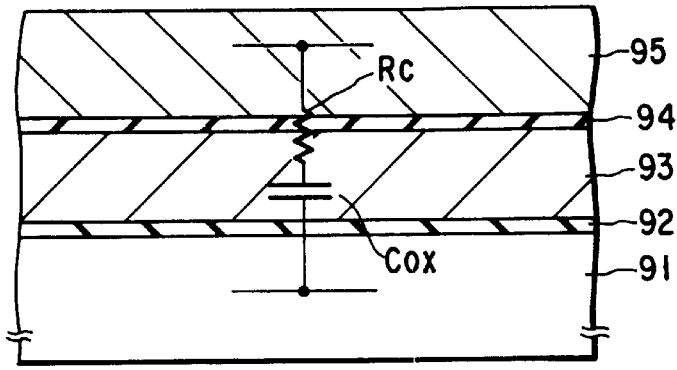
FIGS. 11A and 11B are a sectional view of a gate electrode and an equivalent circuit diagram thereof, respectively, for explaining the RC delay inherent in the gate electrode.
Figure 11B:
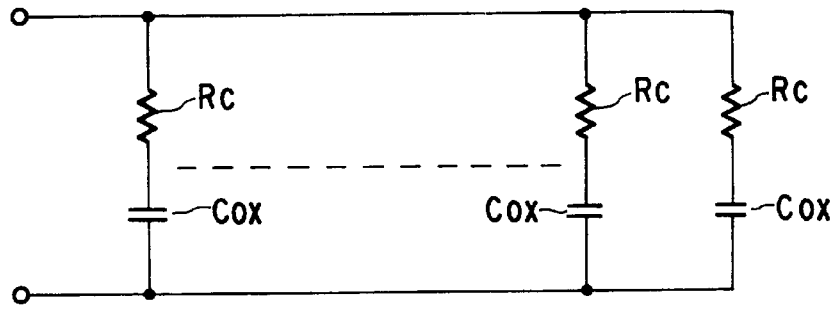

FIG. 11A is a sectional view of a gate electrode. The gate electrode comprises a gate oxide film 92 formed on a silicon substrate 91, a polycrystalline silicon film 93, a silicon nitride film 94 formed on the film 93, and a tungsten film 95. The delay of signal transfer through the gate electrode of a semiconductor element is determined by two factors. The factors are a gate capacitor $C_{OX}$ and a contact resistor $R_C$, both connected in series between the silicon substrate 91 and the tungsten film 95. FIG. 11B is an equivalent circuit diagram of the structure shown in FIG. 11A. Here, the sheet resistance of the gate electrode can be neglected to estimate the $R_C$ caused $R_C$ and $C_{OX}$, because it contributes to the RC delay of the gate electrode, but far less than does the contact resistor $R_C$.

As can be understood from FIGS. 11A and 11B, the contact resistor $R_C$ and the gate capacitor $C_{OX}$ cause the RC delay. The time constant of the RC delay is the product of the gate capacitor $C_{OX}$ and the contact resistor $R_C$. The resistor $R_C$ is inversely proportional to the area of the gate electrode, whereas the gate capacitor $C_{OX}$ is proportional thereto. Hence, the product of the resistor $R_C$ and the gate capacitor $C_{OX}$, i.e., $R_C \times C_{OX}$, does not depend on the shape of the gate electrode.

If the gate oxide film 92 is 7 nm thick, the gate capacitor $C_{OX}$ will be $4.9 \times 10^{-15}$ $F/\mu m^2$. If the contact resistor RC is about $1 \times 10^3$ $\Omega \mu m^2$, the time constant of the RC delay will be about $4.9 \times 10^{-12}$ sec, which is approximately 5 psec. This RC delay is, as a matter of fact, one RC delay component calculated based on the two factors only, i.e., the contact resistor $R_C$ and the gate capacitor $C_{OX}$. There is another RC delay component which is determined by the sheet resistance of the gate electrode and the gate capacitor $C_{OX}$.

Figure 12A:
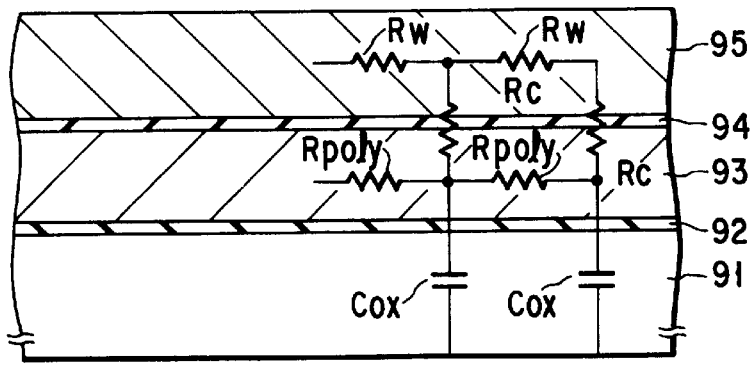
FIGS. 12A and 12B are another sectional view of a gate electrode and another equivalent circuit diagram thereof, respectively, for explaining the RC delay inherent in the gate electrode.
Figure 12B:
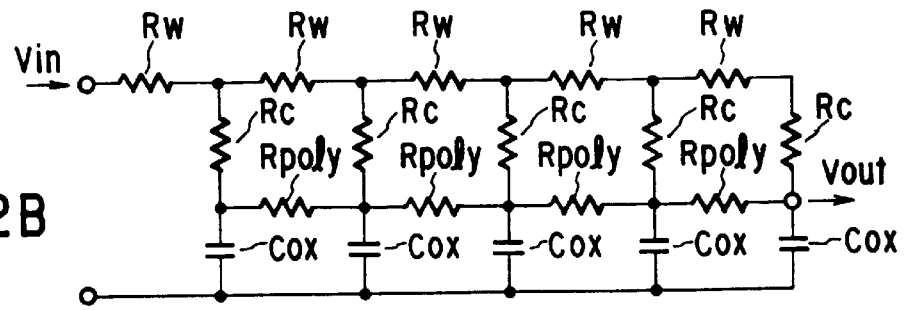

The RC-delay component determined by the sheet resistance and the gate capacitor $C_{OX}$ will be explained, with reference to FIGS. 12A and 12B. As shown in FIG. 12A, the gate electrode has a contact resistor $R_C$, a gate capacitor $C_{OX}$, a resistor $R_{poly}$ of the polycrystalline silicon film 93, and a resistor $R_W$ of the tungsten film 95. FIG. 12B is an equivalent circuit diagram of the structure shown in FIG. 12A. As seen from FIG. 12B, the gate electrode is equivalent to a lumped $R_C$ networks having five stages. The gate capacitor $C_{OX}$ is invariable. It is assumed here that the gate electrode is used in a semiconductor element which has a channel length of 0.25 $\mu$m and a channel width of 20 $\mu$m. The size of the element is similar to that of each MOSFET built in a logic LSI. Here, the delay time of the gate electrode is defined as the time which elapses from the time when a input voltage pulse $V_{in}$ (1V) rising fast within 0.01 psec is applied one end of the gate electrode, until the output voltage $V_{out}$ at the other end (the polycrystalline silicon film 93) of the gate electrode increases to 90% of the input voltage $V_{in}$.

The inventors analyzed the relationship between the contact resistor $R_C$ and the delay time. They found that the delay time sharply increased when the contact resistance $R_C$ increased above 100 $\Omega\mu m^2$, as shown in FIG. 13. They also found that the delay time reached 14 psec when the contact resistance $R_C$ was 1 K$\Omega\mu m^2$.

In the case of an inverter comprising MOSFETs as small as the MOSFET exemplified above, the switching time of each inverter stage is estimated at 30 psec or less, neglecting the parasitic resistance and capacitance of the MOSFET. With respect to this relatively short switching time, the RC delay time of 14 psec, described above, falls outside an allowable range.

In the case of a logic gate comprising the next-generation, sub-half-micron MOSFETs, the switching time of each stage is about a few 10 psec. Hence, the longest RC delay time allowable for a sub-half-micron MOSFET should be only a few picoseconds or less.

Eighth Embodiment

A MOSFET which is the eighth embodiment of this invention will now be described, with reference to FIG. 15H which is a cross sectional view of the MOSFET.

Figure 15A:
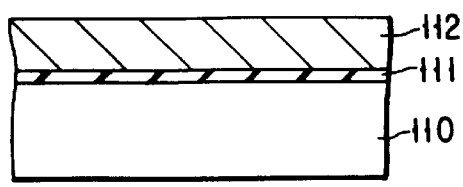
FIGS. 15A to 15H are sectional views explaining a method of manufacturing a MOSFET which is the eighth embodiment of this invention.
Figure 15B:
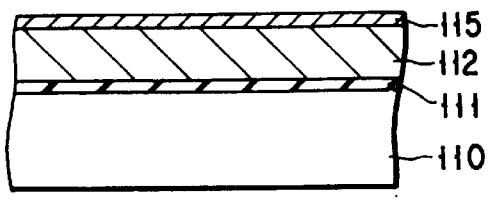
Figure 15C:
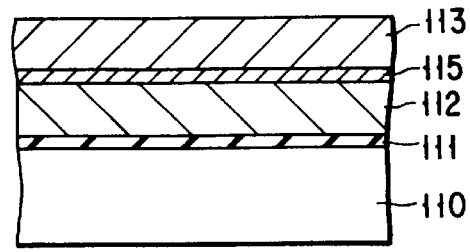
Figure 15D:
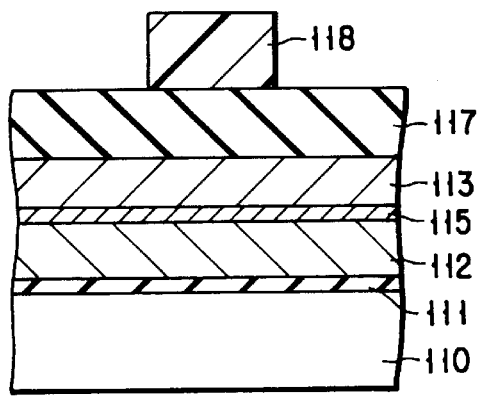
Figure 15E:
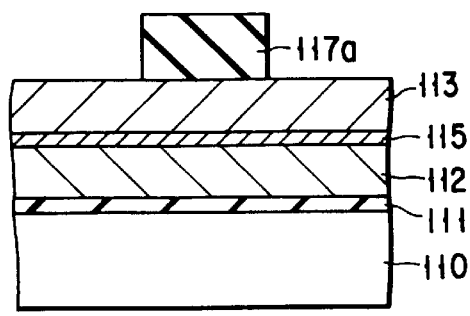
Figure 15F:
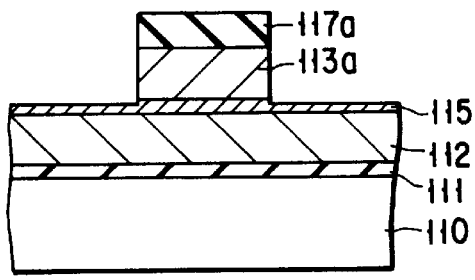
Figure 15G:
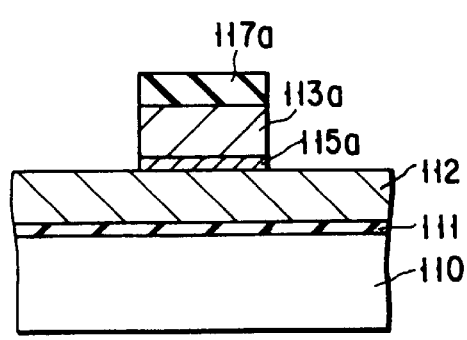
Figure 15H:
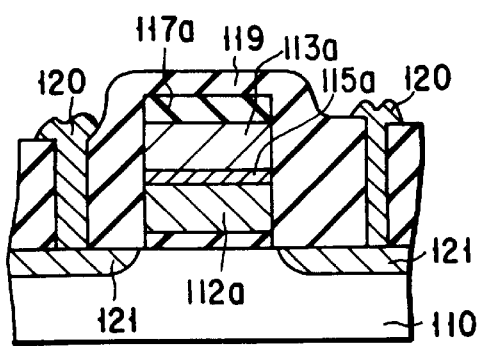

As shown in FIG. 15H, the gate electrode of the MOSFET comprises a polycrystalline silicon film 112a, a silicon carbide film 115a formed on the film 112a, a tungsten film 113a formed on the film 115a, and a silicon nitride film 117a formed on the film 113a. The gate electrode is characterized by the silicon carbide film 115a which is interposed between the polycrystalline silicon film 112a and the tungsten film 113a and which functions as a reaction-preventing film.

The silicon carbide film 115a prevents the polycrystalline silicon film 112a and the tungsten film 113a from reacting with each other. The resistance of the gate electrode is thereby decreased. Further, the film 115a is resistant to the etching gas which is used for etching the tungsten film 113a and, therefore, prevents the polycrystalline silicon film 112a from being etched when the tungsten film 113a is etched with the etching gas. In other words, the silicon carbide film 115a helps to achieve selective etching of the tungsten film 113a. Since the etching of the film 115a little affects the polycrystalline silicon film 112a, the gate electrode can have a good shape and little critical dimension losses.

Having only a low resistance but also a shape as desired, the gate electrode has but a very short RC delay and serves to miniaturize the MOSFET and raise the operating speed of the MOSFET.

A method of manufacturing the MOSFET shown in FIG. 15H will be explained, with reference to FIGS. 15A to 15H which are sectional views explaining the various steps of the method.

At first, as shown in FIG. 15A, a thin silicon oxide film 111, or a gate insulating film, is formed on a silicon substrate 110. A polycrystalline silicon film 111, about 100 nm thick, is then deposited on the silicon oxide film 111. A dopant, or an electrically active impurity, is added to the polycrystalline silicon film 112 by means of, for example, vapor-phase diffusion.

Next, as shown in FIG. 15B, the silicon substrate 110 is heated to about 800° C. in an atmosphere including a hydrogen carbide-based gas such as $C_3H_8$. A silicon carbide film 115 having a thickness of about 10 nm is thereby formed on the polycrystalline silicon film 112.

Further, as illustrated in FIG. 15C, a tungsten film 113, about 100 nm thick, is formed by sputtering on the silicon carbide film 115. After 900° C. annealing manufacturing the MOSFET, the resistance of the gate electrode was measured. No increase in the resistance was observed. Rather, the resistance was found to have decreased. This means that the silicon carbide film 115 prevented the polycrystalline silicon film 112 and the tungsten film 113 from reacting with each other while the silicon substrate 110 was being heated.

Thereafter, as shown in FIG. 15D, a silicon nitride film 117 having a thickness of about 150 nm is formed on the tungsten film 113 by means of, for example, CVD method. A photoresist, about 1 $\mu$m thick, is spin-coated on the silicon nitride film 117 thus formed. The photoresist is exposed to light through a photomask (not shown) and then developed, thereby forming a resist pattern 118 having a specific configuration.

Next, the silicon nitride film 117, the tungsten film 113 and the polycrystalline silicon film 112 are etched by using the resist pattern 118 as a mask, in a dry etching apparatus of the type illustrated in FIG. 17. The dry etching apparatus comprises an etching chamber 300, a pre-etching chamber 400 and a post-etching chamber 500. A substrate 301 is first introduced into the pre-etching chamber 400 and placed on a table 403 provided within the chamber 400. Then, the substrate 301 is transferred into the etching chamber 300 and placed on the electrode 302 located within the chamber 300. After dry-etched, the substrate 301 is transferred from the etching chamber 300 into the post-etching chamber 500 and mounted on a table 503 provided within the chamber 500.

The etching chamber 300 is connected to the pre-etching chamber 400 by a gate valve 401, and to the post-etching chamber 500 by a gate valve 501. Substrates 301 can therefore be dry-etched, one by one, each within a short time. Furthermore, the pre-etching chamber 400 and the post-etching chamber 500 are sealed from the atmosphere by gate valves 402 and 502, respectively, so that substrate 301 may not be adversely influenced by the atmosphere.

The electrode 302 located within the etching chamber 300 is connected to a cooling pipe 303, so that its temperature is controlled to a predetermined value by the coolant circulated in the the cooling pipe 303. Further, the electrode 302 is connected to a high-frequency power supply 306 by a blocking capacitor 304 and a matching device 305. The power supply 306 supplies power of 13.56 MHz to the electrode 302. When supplied with this high-frequency power, the electrode 302 generates plasma in the etching chamber 300.

Connected to the top of the etching chamber 300 is a reaction-gas supply line 600. It is through this line 600 that a reaction gas is introduced into the etching chamber 300. The reaction gas (i.e., etching gas) used is, for example, a mixture of $CHF_3$ gas and $CF_4$ gas. The rate at which the gas is supplied into the chamber 300 is controlled to a desired value by a valve 601 and a flow rate controller 602. The pressure in the etching chamber 300 is thereby maintained at a prescribed value.

Arranged right above the etching chamber 300 is a permanent magnet 307 of about 200 gauss, which is connected to an electric motor 307 by a shaft 308 and can be rotated thereby. When the magnet 307 is thus rotated, a high ion-density plasma can be generated and maintained in the etching chamber 300 even if a high vacuum on the order of $10^{-3}$ Torr. Many ions are emitted from the high ion-density plasma and applied onto the substrate 301 mounted on the electrode 302. Dry etching is thus performed on the substrate 301.

Using the resist pattern 118 as an etching mask, the silicon nitride film 117 is dry-etched by means of the dry etching apparatus, as illustrated in FIG. 15E. As a result of this, a silicon nitride film 117a is formed which has desired size and shape. Thereafter, oxygen plasma is applied, removing the resist pattern 118.

Next, as shown in FIG. 15F, the tungsten film 113 is subjected to anisotropic etching, wherein the silicon nitride film 117a is used as the etching mask and a mixture of $SF_6$ gas and $Cl_2$ gas is used as the etching gas. A tungsten film 113a of desired size and shape is thereby formed. The anisotropic etching is performed at a high-frequency power of 0.7 $W/cm^2$, a pressure of 10 mTorr, by supplying $SF_6$ and $Cl_2$ gas at flow rates of 40 SCCM and 10 SCCM, respectively, while maintaining the temperature of the electrode 302 at 70° C.

Under these etching conditions, the tungsten film 113 is etched at the rate of about 180 nm/min, while the silicon nitride film 117 at the rate of about 50 nm/min. The ratio of etching rate of the tungsten film 113 to that of the silicon nitride film 117 is about 3. Under the same etching conditions, the silicon carbide film 115 is etched at the rate of about 35 nm/min. The ratio of etching rate of the tungsten film 113 to that of the silicon carbide film 115 is therefore about 5. Therefore, if the tungsten film 113 is over-etched for the time required to etch away 30% of the thickness (100 nm) of the tungsten film 113, the silicon carbide film 115 located beneath the tungsten film 113 will be partly etched to have its thickness reduced by about 6 nm. There is no possibility that the silicon carbide film 115 is etched too much in the process of etching the tungsten film 113.

Thereafter, as shown in FIG. 15G, the silicon carbide film 115 is subjected to dry etching, wherein the silicon nitride film 117a is used as the etching mask and a mixture of $CF_6$ gas, $H_2$ gas and $O_2$ gas is used as the etching gas. A silicon carbide film 115a of desired size and shape is thereby formed. The dry etching is performed at a high-frequency power of 0.7 $W/cm^2$, a pressure of 10 mTorr, by supplying $C_2F_6$, $H_2$ gas and $O_2$ gas at flow rates of 40 SCCM, 10 SCCM and 1 SCCM, respectively.

Under these etching conditions, the silicon carbide film 115 is etched at the rate of about 180 nm/min, while the silicon nitride film 117 at the rate of about 100 nm/min. Hence, the ratio of etching rate of the silicon carbide film 115 to that of the silicon nitride film 117 is about 2. The ratio of etching rate of the silicon carbide film 115 to that of the polycrystalline silicon film 112 is about 2. Therefore, over-etching of the silicon carbide film 115 will not influence the polycrystalline silicon film 112 so much.

Then, as illustrated in FIG. 15H, the polycrystalline silicon film 112 is subjected to anisotropic etching, wherein the silicon nitride film 117a, the tungsten film 113a and the silicon carbide film 115a are used as the etching mask and a mixture of HBr gas and $O_2$ is used as the etching gas. A polycrystalline silicon film 112a having desired size and shape is thereby formed. The film 112a, the tungsten film 113a, the silicon carbide film 115a and the silicon nitride film 117a constitute a gate electrode.

Finally, source and drain regions 121 are formed in the surface of the silicon substrate 110 by means of ion implantation, heat treatment or the like. Further, an interlayer insulating film 119 and source and drain electrodes 120 are formed by the method known in the art. As a result, the MOSFET of the structure shown in FIG. 15H is manufactured.

As described above, the silicon carbide film 115 is provided between the polycrystalline silicon film 112 and the tungsten film 113. It is thanks to the silicon carbide film 115 that the tungsten film 113 can be subjected to anisotropic etching in the present embodiment. The silicon carbide film 115 will be described below in detail.

A silicon carbide film is comprised of two phases. The first phase has a composition (Si:C=1:1) which is stoichiometrically stable. The second phase is a SiC phase containing an excessive number of Si atoms or C atoms. Basically, a film of silicon carbide, which contains an excessive number of C atoms, is preferred as a reaction-preventing film for two reasons. First, C atoms hardly react with refractory metal such as tungsten (W), unlike Si atoms, since the diffusion constant of C atoms is far smaller than that of Si atoms in a metal film. Second, a silicon carbide film has a higher density than a silicon carbide film containing an excessive number of Si atoms, and therefore helps Si atoms (capable of readily reacting with refractory metal) to diffuse into a film of refractory metal.

However, a silicon carbide film in which the ratio of C atoms exceeds 75 atomic % becomes less resistant to oxidation when heated. It is therefore desired that a silicon carbide film whose carbon atom ratio ranges from 50 to 75% be utilized in this invention. The most preferable for use in the invention is a silicon carbide film which has a carbon atom ratio of about 50 atomic %.

Although silicon carbide is a semiconductor, it can have its specific resistance sufficiently reduced by adding to it an electrically active impurity. In the present invention, the silicon carbide film is formed by conducting heat treatment in a $C_3H_8$ atmosphere. Thus, the silicon carbide film can have a low sheet resistance of about 100 to about 1000 Ω per unit area, merely by adding $PH_3$ gas to $C_3H_8$. This specific sheet resistance is nearly equal to that of polycrystalline silicon. Phosphorus (i.e., an n-type impurity) in the $PH_3$ gas functions as an electrically active impurity. There are some other electrically active impurities. Among them are n-type ones such as N, As and Sb and p-type ones such as B, Al and Ga.

The method of forming the silicon carbide film 115 is not limited to the one described above. Rather, the film 115 may be formed by two other methods. The first alternative method is to electrically discharge a carbon-containing gas, generating plasma, and then apply the plasma onto the surface of the polycrystalline silicon film 112. The second alternative method is to apply a mixture of carbon gas and silicon gas onto the surface of the polycrystalline silicon film 112.

Ninth Embodiment

A MOSFET which is the ninth embodiment of the present invention will now be described. This MOSFET has the same structure as the MOSFET shown in FIG. 15H, which is the eighth embodiment of the invention.

A method of manufacturing this MOSFET will be explained, with reference to FIGS. 16A to 16E and FIGS. 15D to 15H, which are sectional views explaining the various steps of the method.

Figure 16A:
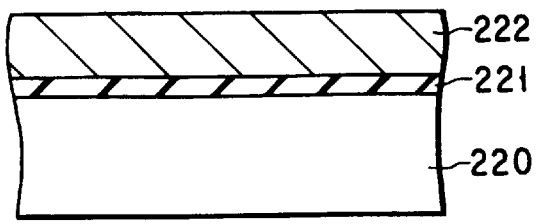
FIGS. 16A to 16E are sectional views explaining a method of manufacturing a MOSFET which is the ninth embodiment of this invention.

First, as illustrated in FIG. 16A, a silicon oxide film 221 is formed on a single-crystal silicon substrate 220. The silicon oxide film 221 has a thickness of about 7 nm and is used as a gate oxide film. A polycrystalline silicon film 222, about 100 nm thick, is deposited on the silicon oxide film 221 by means of CVD method. A dopant, or an electrically active impurity, is added to the polycrystalline silicon film 222 by means of vapor-phase diffusion.

Figure 16B:
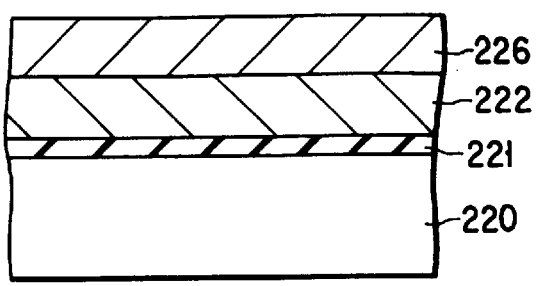

Next, as shown in FIG. 16B, a carbide film 226 having a thickness of about 100 nm is formed by sputtering on the polycrystalline silicon film 222.

Figure 16C:
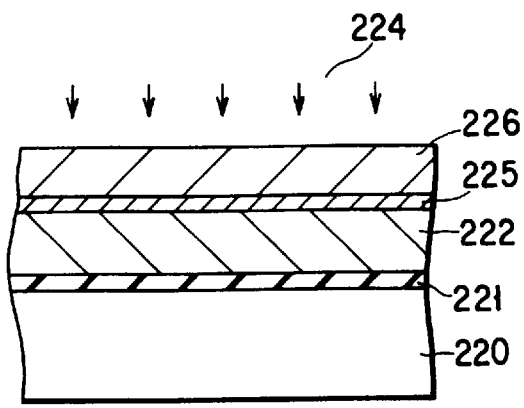

Then, as shown in FIG. 16C, silicon ions (Si⁺) are implanted into the resultant structure, from above the carbide film 226 at an acceleration voltage of 50 kev and a dose of $5\times10^{15}$ cm$^{-3}$. The acceleration voltage is set at the specific value of 50 keV in order that the projected range of the ions implanted may exist in the vicinity of the interface between the polycrystalline silicon film 222 and the carbide film 226.

As a result of the ion implantation, C atoms and Si atoms mix together at the interface between the polycrystalline silicon film 222 and the carbide film 226, forming a silicon carbide film 225. The silicon carbide film 225 is about 10 nm thick and has a C atom ratio of about 60 atomic %. The silicon carbide film 225 can be formed by another method such as sputtering, as will be explained later.

The thickness of the silicon carbide film 225 depends on the dose of silicon ions implanted. If the dose is less than $5\times10^{15}$ cm$^{-3}$, the silicon carbide film 225 will have a thickness of 5 nm or less and a C atom ratio of more than 75 atomic %. A silicon carbide film formed at an ion dose of less than $5\times10^{15}$ cm$^{-3}$ cannot be used as a reaction-preventing film. In view of this, it is necessary to implant silicon ions at a dose of $5\times10^{15}$ cm$^{-3}$ or more. The preferable value for the ion dose is reciprocally proportional to the mass number of the ion element. In the case of ions of As (mass number: about 75), the preferable ion dose is about $2\times10^{15}$ cm$^{-3}$ or more. If silicon ions are implanted at a dose of $1\times10^{17}$ cm$^{-3}$ or more, the concentration of Si atoms will increase toward the bottom of the silicon carbide film 225. Nonetheless, the top region of the at portion of the film 225 on which a refractory metal film is to be formed later has a C atom ratio falling within a range of 50 to 75 atom %, and the silicon nitride film 225 can therefore effectively act as a reaction-preventing film.

Figure 16D:
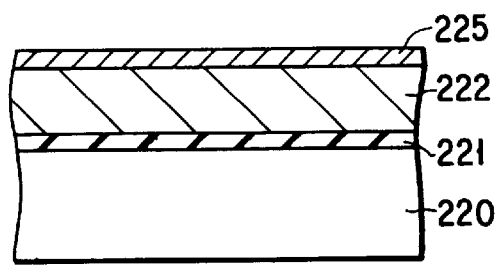

Thereafter, as shown in FIG. 16D, the carbide film 226 is removed from the structure. At this time, the silicon carbide film 225 remains intact since it is very resistant to oxidation.

Figure 16E:
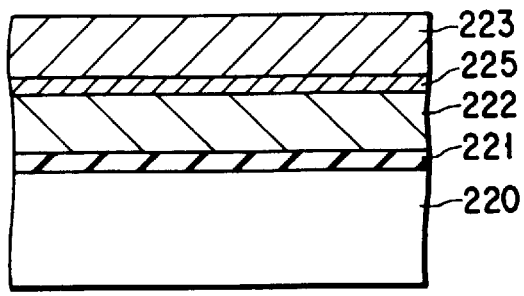

Next, as illustrated in FIG. 16E, a tungsten film 223, about 100 nm thick, is formed by sputtering on the silicon carbide film 225.

A structure shown in FIG. 16E was actually heated at 800 to 900° C. No increase was found in the resistance of a gate electrode. This means that the silicon carbide film 225 formed through the mixture of C atoms and Si atoms induced by the ion implantation did effectively worked as a reaction-preventing film.

Since ions of an electrically active impurity are implanted to form the silicon carbide film 225, the formation of the silicon carbide film 225 and the doping of the polycrystalline silicon film 222 can be accomplished in a single process step, i.e., the implantation of those impurity ions. Furthermore, the polycrystalline silicon film 222 can have a desired resistance, merely by selecting the conductivity type of the impurity ions. Still further, the structure shown in FIG. 16C may be heated after the ion implantation, thereby to impart a higher density to the silicon carbide film 225 and ultimately enable the film 225 to function as a more effective reaction-preventing film.

Thereafter, the films 221, 222, 225 and 223 are etched in the same apparatus, at such etching rates and by using the same etching gases as in the eighth embodiment and as explained with reference to FIGS. 15D to 15G. Finally, source and drain regions are formed in the surface of the silicon substrate 220, an inter-layer insulating film and source and drain electrodes are formed in the same manner as in the eighth embodiment and as described with reference to FIG. 15H. As a result, the MOSFET of the structure shown in FIG. 15H is manufactured.

In the ninth embodiment, the silicon carbide film 225 is formed by ion implantation. Instead, a silicon carbide film may be formed by sputtering. In this sputtering method, a compound target made of SiC having a stoichiometrically stable composition (Si:C=1:1) is spaced apart from the substrate 220 by a distance of 10 cm, and is RF-sputtered at an Ar gas pressure of 10 mTorr, thereby forming a silicon carbide film. The silicon nitride film, thus formed, has a composition of: Si:C=4:6. In other words, this film is made of carbon-rich silicon carbide. This is because C atoms have a longer mean free path than Si atoms. The longer the distance between the substrate and the target, the more carbon-rich the silicon carbide is. It follows that the silicon carbide film can have a C atom ratio of 50 to 70 atomic %, only by adjusting the distance between the substrate and the target.

Alternatively, a silicon carbide film may be formed by performing reactive sputtering on a silicon target, by using, as the sputtering gas, a mixture of a carbon-containing gas such as CH$_4$ gas and an inert gas such as Ar gas. In this sputtering method, a sputtering gas and a target may be used as sputtering the silicon source and the carbon source, respectively. More specifically, a carbon target may be subjected to reactive sputtering, using a mixture of a silicon-containing gas such as SiH$_4$ and an inert gas such as Ar gas, to form a silicon carbide film; or a SiC target may be subjected to reactive sputtering, using a mixture of a carbon-containing gas such as CH$_4$ or a silicon-containing gas such as SiH$_4$ and an inert gas such as Ar gas, to form a silicon carbide film.

In the eighth and ninth embodiments, the silicon carbide film is interposed between the tungsten film and the polycrystalline silicon film. The tungsten film may be replaced by any other metal film that is etched at a lower rate than the silicon film provided underneath and that can react with silicon when heated at 600° C. or more to form metal silicide. Furthermore, the polycrystalline silicon film may be replaced by a film of single-crystal silicon, amorphous silicon film or the like, which is more heat-resistant and less readily etched than refractory metals. If the tungsten film may be replaced by such an other metal film, or if the polycrystalline silicon film is replaced by a film of other silicon material, the advantages of the eighth and ninth embodiment will be attained, as well.

Both the eighth embodiment and the ninth embodiment are each a gate electrode of a MOSFET. Nevertheless, the present invention can be applied to the electrodes of any other type of a transistor, such as a bipolar transistor. Moreover, this invention can be applied to electrodes and wiring which have a low resistance, which are shaped as designed, which are thin and small, and which are, therefore, suitable for use in, particularly, semiconductor memory devices and semiconductor integrated circuits.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming a semiconductor film consisting essentially of a semiconductor containing a semiconductor element on a substrate;

depositing a first conductive film containing a metal and nitrogen on said semiconductor film, said metal being of such a type that a decrease in Gibbs free energy occurring in forming a nitride of said metal from said metal is smaller than a decrease in Gibbs free energy occurring in forming a nitride of said semiconductor element from said semiconductor element; and heating said first conductive film, thereby changing all or part of said first conductive film to a second conductive film consisting essentially of said metal, and thereby forming a third conductive film containing nitrogen and said semiconductor element and positioned in contact with said semiconductor film between said second conductive film and said semiconductor film to form at least one of an electrode and a wiring which includes said semiconductor film, said second conductive film, and said third conductive film.

2. The method according claim 1, further comprising a step of depositing a metal film consisting essentially of a metal on said first conductive film, between said step of depositing said first conductive film and said step of heating said first conductive film.

3. The method according to claim 2, wherein said first conductive film and said metal film consist of the same metal.

4. The method according to claim 1, wherein said semiconductor element consists of silicon, and said metal of said first conductive film consists of a metal selected from the group consisting of tungsten, molybdenum, niobium, tantalum, and copper.

5. The method according to claim 4, wherein said semiconductor consists essentially of silicon.

6. The method according to claim 1, wherein said at least one of an electrode and a wiring comprises a gate electrode.

7. A method of manufacturing a semiconductor device, comprising the steps of:

forming a semiconductor film consisting essentially of a semiconductor containing a semiconductor element on a substrate;

depositing a first conductive film containing a metal and nitrogen on said semiconductor film, said metal being of such a type that a decrease in Gibbs free energy occurring in forming a nitride of said metal from said metal is smaller than a decrease in Gibbs free energy occurring in forming a nitride of said semiconductor element from said semiconductor element; and heating said first conductive film, thereby changing all or part of said first conductive film to a second conductive film containing nitrogen, said metal, and said semiconductor element, and positioned in contact with said semiconductor film to form at least one of an electrode and a wiring which includes said semiconductor film and second conductive film.

8. The method according to claim 7, further comprising a step of depositing a metal film consisting essentially of a metal on said first conductive film, between said step of depositing said first conductive film and said step of heating said first conductive film.

9. The method according to claim 8, wherein said first conductive film and said metal film consist of the same metal.

10. The method according to claim 7, wherein said semiconductor element consists of silicon, and said metal of said first conductive film consists of a metal selected from the group consisting of tungsten, molybdenum, niobium, tantalum, and copper.

11. The method according to claim 10, wherein said semiconductor consists essentially of silicon.

12. The method according to claim 7, wherein said at least one of an electrode and a wiring comprises a gate electrode.

13. The method according to claim 1 or 7, wherein said semiconductor film is a silicon film or a silicon germanium film.

14. A method of manufacturing a semiconductor device, comprising the steps of:

forming a silicon film on a semiconductor substrate;

forming a silicon carbide film on said silicon film, said silicon carbide film having a ratio of carbon atoms ranging from 50 to 75 atomic %;

forming a metal film on said silicon carbide film; and performing selective anisotropic etching on said silicon film, said silicon carbide film and said metal film to form at least one of an electrode and a wiring.

15. The method according to claim 14, wherein said step of forming said silicon carbide film comprises the steps of:

forming a carbon film on said silicon film; and implanting ions into said carbon film to mix carbon atoms and silicon atoms at an interface between said carbon film and said silicon film.

16. The method according to claim 15, wherein said ions are those of an electrically active impurity.

17. The method according to claim 14, further comprising a step of oxidizing a part of said silicon film.

18. A method of manufacturing a semiconductor device, comprising the steps of:

forming a semiconductor film consisting essentially of a semiconductor containing silicon on a substrate;

depositing a first conductive film containing tungsten and nitrogen on said semiconductor film; and heating said first conductive film, thereby changing all or part of said first conductive film to a second conductive film consisting essentially of tungsten, and thereby forming a third conductive film containing nitrogen and silicon and positioned in contact with said semiconductor film between said second conductive film and said semiconductor film to form at least one of an electrode and a wiring which includes said semiconductor film, said second conductive film, and said third conductive film.

19. The method according to claim 18, further comprising a step of depositing a metal film consisting essentially of tungsten on said first conductive film, between said step of depositing said first conductive film and said step of heating said first conductive film.

20. Tho method according to claim 18, wherein said semiconductor consists essentially of silicon.

21. The method according to claim 18, wherein said at least one of an electrode and a wiring comprises a gate electrode.

22. A method of manufacturing a semiconductor device, comprising the steps of:

forming a semiconductor film consisting essentially of a semiconductor containing silicon on a substrate;

depositing a first conductive film containing tungsten and nitrogen on said semiconductor film; and heating said first conductive film, thereby changing all or part of said first conductive film to a second conductive film containing nitrogen, tungsten, and silicon, and positioned in contact with said semiconductor film to form at least one of an electrode and a wiring which includes said semiconductor film and second conductive film.

23. The method according to claim 22, further comprising a step of depositing a metal film consisting essentially of tungsten on said first conductive film, between said step of depositing said first conductive film and said stop of heating said first conductive film.

24. The method according to claim 22, wherein said semiconductor consists essentially of silicon.

25. The method according to claim 23, wherein said at least one of an electrode and a wiring comprises a gate electrode.

* * * * *

UNITED STATES PATENT AND TRADEMARK OFFICE
CERTIFICATE OF CORRECTION

PATENT NO. : 6,100,193
DATED : August 8, 2000
INVENTOR(S): Shintaro SUEHIRO, et al.

It is certified that an error appears in the above-identified patent and that said Letters Patent is hereby corrected as shown below:

On the Title Page, Item [30] the Foreign Application Priority Data is missing. It should read as follows:

[30]           Foreign Application Priority Data

Dec. 28, 1993   [JP]   Japan ................................... 5-349532
Sept. 30, 1994  [JP]   Japan ................................... 6-236256
Sept. 30, 1994  [JP]   Japan ................................... 6-237733

Signed and Sealed this

Seventeenth Day of April, 2001

Attest:

NICHOLAS P. GODICI

Attesting Officer       Acting Director of the United States Patent and Trademark Office